United States Patent
Glass et al.

(10) Patent No.: US 12,432,964 B2
(45) Date of Patent: Sep. 30, 2025

(54) CO-INTEGRATED GALLIUM NITRIDE (GAN) AND COMPLEMENTARY METAL OXIDE SEMICONDUCTOR (CMOS) INTEGRATED CIRCUIT TECHNOLOGY

(71) Applicant: Intel Corporation, Santa Clara, CA (US)

(72) Inventors: Glenn A. Glass, Portland, OR (US);
Anand S. Murthy, Portland, OR (US);
Robert Ehlert, Portland, OR (US);
Han Wui Then, Portland, OR (US);
Marko Radosavljevic, Portland, OR (US); Nicole K. Thomas, Portland, OR (US); Sandrine Charue-Bakker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 977 days.

(21) Appl. No.: 17/030,221

(22) Filed: Sep. 23, 2020

(65) Prior Publication Data
US 2022/0093790 A1   Mar. 24, 2022

(51) Int. Cl.
*H01L 29/78* (2006.01)
*H10D 30/65* (2025.01)
*H10D 62/824* (2025.01)
*H10D 62/85* (2025.01)
*H10D 64/00* (2025.01)
*H10D 84/85* (2025.01)

(52) U.S. Cl.
CPC .......... *H10D 30/65* (2025.01); *H10D 62/824* (2025.01); *H10D 62/8503* (2025.01); *H10D 64/111* (2025.01); *H10D 84/85* (2025.01)

(58) Field of Classification Search
CPC ............ H01L 29/7816; H01L 29/2003; H01L 29/205; H01L 27/092
USPC ........................................................ 257/76
See application file for complete search history.

(56) References Cited

U.S. PATENT DOCUMENTS

| | | | |
|---|---|---|---|
| 2014/0091308 A1* | 4/2014 | Dasgupta | H01L 29/0847 257/E21.403 |
| 2016/0284647 A1* | 9/2016 | Cao | H10D 30/00 |
| 2018/0331082 A1* | 11/2018 | Then | H01L 23/66 |
| 2018/0331156 A1* | 11/2018 | Then | H03H 9/562 |
| 2019/0020343 A1* | 1/2019 | Lee | H01L 24/20 |
| 2019/0371729 A1* | 12/2019 | Cueva | H01L 21/743 |

* cited by examiner

*Primary Examiner* — Dzung Tran
(74) *Attorney, Agent, or Firm* — Schwabe, Williamson & Wyatt, P.C.

(57) ABSTRACT

Co-integrated gallium nitride (GaN) complementary metal oxide semiconductor (CMOS) integrated circuit technology is described. In an example, a semiconductor structure includes a silicon (111) substrate having a first region and a second region. A structure including gallium and nitrogen is on the first region of the silicon (111) substrate, the structure including gallium and nitrogen having a top surface. A structure including germanium is on the second region of the silicon (111) substrate, the structure including germanium having a top surface co-planar with the top surface of the structure including gallium and nitrogen. A dielectric spacer is laterally between and in contact with the structure including gallium and nitrogen and the structure including germanium, the dielectric spacer on the silicon (111) substrate.

9 Claims, 14 Drawing Sheets

CO-INTEGRATED GALLIUM NITRIDE (GAN) AND COMPLEMENTARY METAL OXIDE SEMICONDUCTOR (CMOS) INTEGRATED CIRCUIT TECHNOLOGY

TECHNICAL FIELD

Embodiments of the disclosure are in the field of advanced integrated circuit structure fabrication and, in particular, co-integrated gallium nitride (GaN) complementary metal oxide semiconductor (CMOS) integrated circuit technology.

BACKGROUND

Power delivery and RF communication are essential to every compute solution. Si and group III-V technologies are facing fundamental limits in power and RF. Future compute solutions will require a better semiconductor technology to continue to deliver better energy efficiencies, better performance, and more functionalities in smaller form factors. Two industry trends are converging to transform power delivery and RF: 300 mm gallium nitride (GaN)-on-Si and monolithic 3D ICs. Amongst semiconductor technologies today, GaN is best for power delivery and RF due to its wide bandgap qualities.

DESCRIPTION OF THE EMBODIMENTS

Figure 1A:
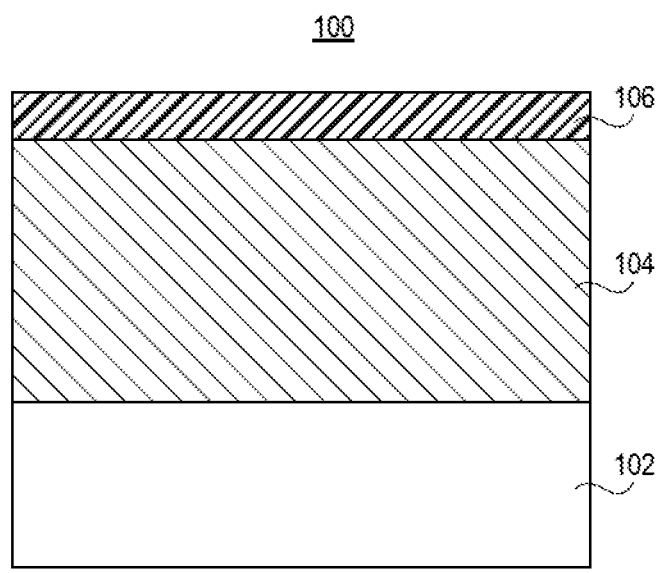
FIGS. 1A-1D illustrate cross-sectional views representing various operations in a method of fabricating a co-integrated gallium nitride (GaN) complementary metal oxide semiconductor (CMOS) integrated circuit, in accordance with embodiments of the present disclosure.

Co-integrated gallium nitride (GaN) complementary metal oxide semiconductor (CMOS) integrated circuit technology is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with embodiments of the present disclosure, CMOS compatible GaN device integration is described. Implementation of embodiments described herein can enable full integration of energy-efficient, truly compact power delivery and RF solutions with CMOS digital signal processing, logic computation and control, memory functions and analog circuitries for next generation power delivery, RF (5G and beyond) and SoC applications.

To provide context, depletion mode devices are leaky. Use of p-type doping in GaN devices requires dedicated tooling and is thus costly and time consuming. However, integration of CMOS with GaN based RF devices is challenging.

In a first aspect, substrates for co-integration are described.

In accordance with one or more embodiments of the present disclosure, on-die integration is disclosed herein with thick germanium rich layers from an original Si 111 surface. Such a selective buffer layer concept is able to fully match the height of the GaN devices and act as a substrate for on-die integration of Si, SiGe and/or Ge devices that would act as CMOS logic to complement the RF functions. In embodiments, open areas are used on-die to dig trenches through the GaN stack all the way to the bulk Si substrate. The sidewalls lines, and Ge is selectively grown to completely fill the trench. The structure can then be planarized, and a CMOS transistor array structure can be fabricated on the newly formed regions.

In an embodiment, a co-planar surface to integrate column IV CMOS and GaN RF on a single die is provided, e.g., to co-integrate RF and CMOS. Embodiments may be implemented by etching deep trenches and fabricating Ge layers nucleated from an original Si substrate. Fabrication of Ge p-MOS devices can be performed to complete co-planar c-MOS, e.g., n-type GaN devices integrated with p-type metal oxide semiconductor (MOS) devices.

As an exemplary process flow, FIGS. 1A-1D illustrate cross-sectional views representing various operations in a method of fabricating a co-integrated gallium nitride (GaN) complementary metal oxide semiconductor (CMOS) integrated circuit, in accordance with embodiments of the present disclosure.

Referring to FIG. 1A, a starting structure 100 is based on a Si (111) substrate 102. In an embodiment, substrate 102 is a bulk substrate composed of crystalline silicon which can be doped with a charge carrier, such as but not limited to phosphorus, arsenic, boron or a combination thereof. In another embodiment, substrate 102 is a bulk substrate having an epitaxial layer grown atop a distinct crystalline substrate, e.g. a silicon epitaxial layer grown atop a boron-doped bulk silicon monocrystalline substrate.

Referring again to FIG. 1A, a GaN stack 104 is grown on the Si (111) substrate 102. In an embodiment, growth of GaN stack 104 begins with growth of an AlN barrier/nucleation layer followed by growth of a GaN material. In one embodiment, the GaN material is a graded GaN stack with one or more carbon containing layers. A polarization layer 106 is then grown on the GaN stack 104. In one embodiment, the polarization layer 106 includes an AlN or SiN layer, and then an AlGaN or InAlGaN layer.

Figure 1B:
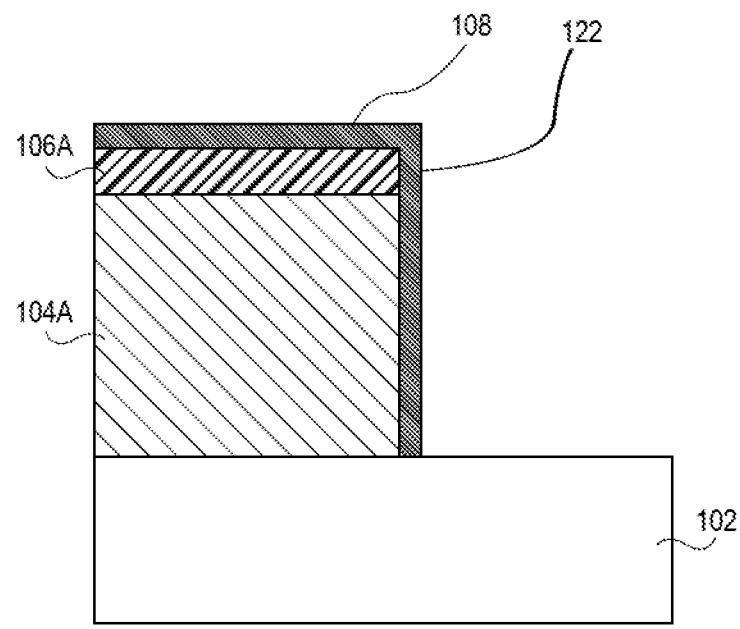

Referring to FIG. 1B, structure 100 of FIG. 1A is patterned to form patterned GaN stack 104A and patterned polarization layer 106A, e.g., by etching deep trenches to an original Si surface of substrate 102 in regions intended to be CMOS regions. A patterning hardmask 108 can be retained on the patterned polarization layer 106A. A spacer structure 122 can be formed along a vertical sidewall of the patterned GaN stack 104A and patterned polarization layer 106A. In one embodiment, the spacer structure 122 is composed of a same material as the patterning hardmask 108, as is depicted.

Figure 1C:
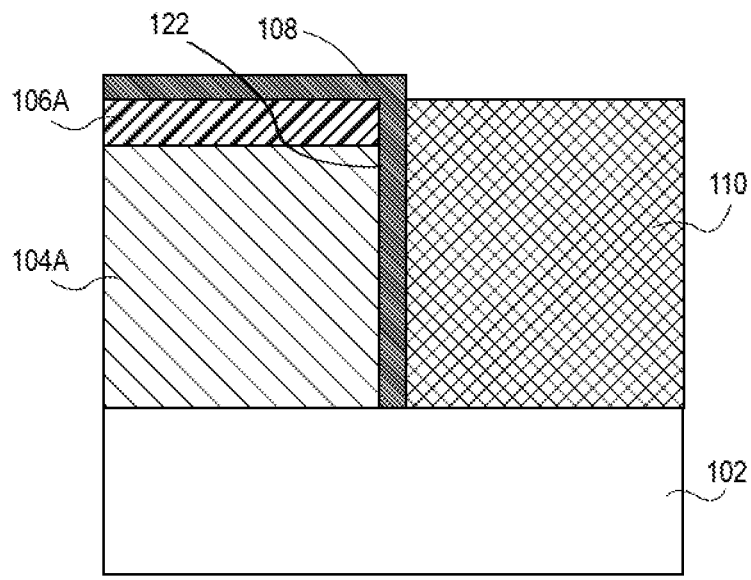

Referring to FIG. 1C, a selective deposition of a Ge or Ge-rich alloy 110 is performed on the structure of FIG. 1B. In one embodiment, the selective deposition of the Ge or Ge-rich alloy (also known as single phase mixture) 110 to slightly overfill the trench, as is depicted. The Ge-rich alloy layer can be of constant composition, graded or multilayer as desired to facilitate strain and defect reduction.

The structure of FIG. 1C can then be planarized to a level that stops on the patterning hardmask 108. With the hardmask 108 in place, the Ge or Ge-rich alloy 110 can be etched back, and a device quality layer of silicon germanium or Si can be formed thereon.

Figure 1D:
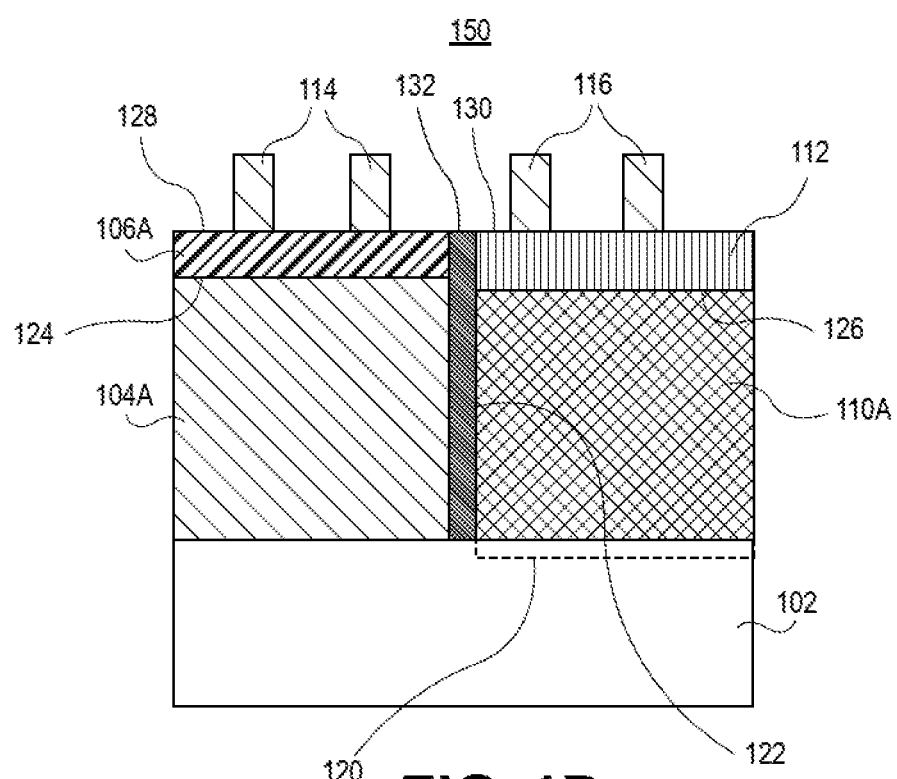

Referring to FIG. 1D, a second planarization can be performed to provide a structure 150. On the left-hand side of structure 150, the polarization layer 106A is exposed. On the right-hand side of structure 150, a silicon germanium layer 112 is exposed. The silicon germanium layer 112 is on a recessed Ge or Ge-rich alloy layer 110A. The spacer structure is between the polarization layer 106A and the silicon germanium layer 112. In one embodiment, as is depicted, the silicon germanium layer 112 has a bottom surface 126 below a bottom surface 124 of the polarization layer 106A. In other embodiments, the silicon germanium layer 112 has a bottom surface 126 co-planar with or above the bottom surface 124 of the polarization layer 106A.

Accordingly, in an embodiment, trench formation in a GaN stack is performed to accommodate germanium growth on an exposed Si (111) surface. It is to be appreciated that such etch back may not stop perfectly on the Si (111) substrate and, as such, in some embodiments a recess 120 is formed into the Si (111) surface. In any case, etch back of a grown Ge material is then performed to accommodate device quality SiGe material. In other embodiments, it is possible to fabricate devices directly in the initially grown Ge as well. In either case, processing for gates in either an up-front high-k flow or a replacement metal gate (RMG) flow may then be performed. Subsequent processing may include source or drain (S/D) formation for the three different device types (e.g., N-type GaN devices, N-type CMOS devices, and P-type CMOS devices), e.g., by masking and processing one type/polarity at a time.

With reference again to FIG. 1D, in accordance with an embodiment of the present disclosure, a semiconductor structure 150 includes a silicon (111) substrate 102 having a first region (left-hand side) and a second region (right-hand side). A structure 104A/106A including gallium and nitrogen is on the first region of the silicon (111) substrate 102. The structure 104A/106A including gallium and nitrogen has a top surface 128. A structure 110A/126/112 including germanium is on the second region of the silicon (111) substrate 102. The structure 110A/126/112 including germanium has a top surface 130 co-planar with the top surface 128 of the structure 104A/106A including gallium and nitrogen. A dielectric spacer 122 is laterally between and in contact with the structure 104A/106A including gallium and nitrogen and the structure 110A/126/112 including germanium.

In an embodiment, the dielectric spacer 122 is on the silicon (111) substrate 102, as is depicted. In an embodiment, the dielectric spacer 122 has a top surface 132 co-planar with the top surface 130 of the structure 110A/126/112 including germanium and with the top surface 128 of the structure 104A/106A including gallium and nitrogen, as is depicted. In an embodiment, the dielectric spacer is or includes silicon nitride or silicon oxide.

In an embodiment, the structure 104A/106A including gallium and nitrogen includes a polarization layer 106A on a gallium nitride layer (all or a portion of 104A). In one such embodiment, the polarization layer 106A includes AlGaN or InAlGaN. In an embodiment, the structure 104A/106A including gallium and nitrogen includes a gallium nitride layer (upper portion of 104A) on an AlN layer (lower portion of 104A).

In an embodiment, the structure 110A/126 including germanium includes a layer 112 of SiGe on a layer 110A of Ge. In another embodiment, the structure 110A/126 including germanium includes a first layer 112 of SiGe on a second layer 110A of SiGe. In such an embodiment, the second layer 110A of SiGe has a greater germanium concentration than the first layer 112 of SiGe.

In an embodiment, the structure 104A/106A including gallium and nitrogen has a first plurality of semiconductor devices 114 thereon. In one such embodiment, the first plurality of semiconductor devices 114 has a voltage supply in a range of 5-10 Volts. The structure 110A/126/112 including germanium has a second plurality of semiconductor devices 116 thereon. In one such embodiment, the second plurality of semiconductor devices 116 has a voltage supply of approximately 1 Volt. In one embodiment, wherein the second plurality of semiconductor devices 116 is a plurality of complementary metal oxide semiconductor (CMOS) devices.

It is to be appreciated that, in a particular embodiment, a CMOS device layer and/or a layer underlying a CMOS device layer may be composed of germanium silicon germanium. As used throughout, a silicon germanium layer may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 60% germanium and approximately 40% silicon ($Si_{0.4}Ge_{0.6}$). In other embodiments, the amount of silicon is greater than the amount of germanium. In particular embodiments, a silicon germanium layer includes approximately 30% germanium and approximately 70% silicon ($Si_{0.7}Ge_{0.3}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is also to be appreciated that graded and/or multilayer compositions may be implemented to manage dislocation defect densities and strain. It is to be appreciated that a silicon germanium layer as described herein may be undoped or may be doped with dopant atoms such as boron, phosphorous or arsenic.

It is also to be appreciated that, in a particular embodiment, a layer underlying a CMOS device layer may be composed of germanium. As used throughout, a germanium layer may be used to describe a germanium material composed of a very substantial amount of, if not all, germanium. However, it is to be appreciated that, practically, 100% pure Ge may be difficult to form and, hence, could include a tiny percentage of carbon, silicon or tin. Such impurities may be included as an unavoidable impurity or component during deposition of Ge or may "contaminate" the Ge upon diffusion during post deposition processing. As such, embodiments described herein directed to a germanium layer may include a germanium layer that contains a relatively small amount, e.g., "impurity" level, non-Ge atoms or species, such as Si, C or Sn. It is to be appreciated that a germanium layer as described herein may be undoped or may be doped with dopant atoms such as boron, phosphorous or arsenic.

To provide further context, today, products are pushing the envelope of power delivery towards 2000 W and beyond. This demands compact high power solutions that only GaN 3D IC can provide. Power delivery experts can now be empowered to re-think the entire power delivery chain from 48V-to-1V, from servers to clients, how to achieve higher efficiencies as well as higher frequencies to shrink inductor size. Emergence of new communication standards at ever higher frequencies and larger bandwidths, e.g. WiFi 7, and convergence of 5G wireless and WiFi, demand cost effective, efficient and compact high-power RF frontend solutions that only 300 mm GaN 3D IC can provide. In a 5G basestation/picocell, a phase array solution based on Si or SiGe technology would require >1000 RF power amplifiers (PAs) to produce the same RF output power that can be achieved with about 100 GaN RF PAs. Moreover, the phase array based on GaN 3D IC could be about 10× cheaper and consume up to about 35% less power.

In a second aspect, GaN devices (such as high voltage scaled GaN devices) are described. Such GaN devices may be fabricated on a GaN portion of the substrate 150 described in association with FIGS. 1A-1D.

To provide context, RF power amplifiers (RF PAs) are needed to transmit RF signals between mobile devices and base stations located at far distances away, such as greater than 1 mile. The efficiency of these RF PAs is a key determinant of battery life in mobile handsets and power consumption (cost) in RF base stations. Good linearity of the RF power amplifier is required for modern communication standards such as 4G LTE and 5G standards. RF PAs typically operate at several dB back-off from its saturated mode in order to meet the linearity requirements. Thus, the efficiency suffers and in most PAs, it may degrade by a factor of 2-3×.

Due to its wide bandgap and high critical breakdown electric field, gallium nitride (GaN) transistors are considered for high voltage applications such as power converters, RF power amplifiers, RF switch and high voltage applications. Simple transistor architecture, namely, having a single gate, source and drain, falls short of realizing the full potential of GaN in achieving the maximum breakdown voltage as dictated by its material properties. This is because the drain electric field concentrates at the edge of the gate and causes premature breakdown.

Embodiments of the present disclosure relate to gallium nitride (GaN) transistors having drain field plates. In embodiments, the transistors of the present disclosure have a gallium nitride (GaN) layer disposed above a substrate. A gate structure is disposed above the GaN layer. A source region and a drain region are disposed on opposite sides of the gate structure. The drain field plate may be biased to an electrical potential which is different than a gate voltage and/or VSS offering a greater degree of control of the drain field. The transistors of the present disclosure may enable new circuit architectures, such as a cross-coupled pairs. Additionally, the distance the drain field plate extends above the drain can be independently adjusted to improve the affect the field plate has on the drain field distribution, and hence increase breakdown voltage and linearity. In an embodiment, the transistor is operated in an enhancement mode. In an embodiment the gate structure may have a "T" shape in order to reduce the electrical resistance of the gate structure. In an embodiment, the transistor may include a second gate structure or multiple gate structures disposed between the gate structure and the drain field plate to provide a multigate switch for, for example, an RF voltage divider.

Figure 2:
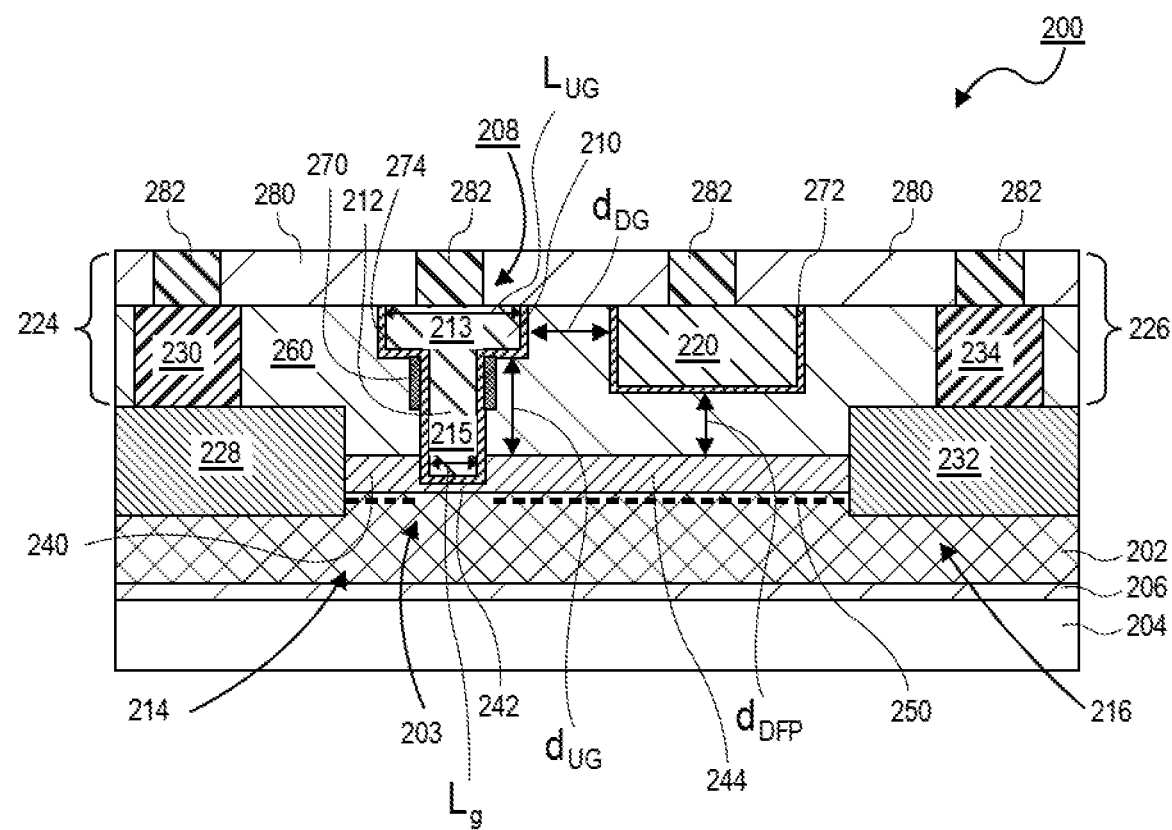
FIG. 2 illustrates a cross-sectional view of a transistor having a drain field plate, in accordance with embodiments of the present disclosure.

FIG. 2 illustrates as transistor 200 having a drain field plate in accordance with embodiments of the present disclosure. Transistor 200 includes a GaN layer 202 disposed above a substrate 204. A buffer layer 206 may be disposed between GaN layer 202 and substrate 204. A gate structure 208 is disposed above GaN layer 202 as illustrated in FIG. 2. Gate structure 208 may include a gate dielectric 210, such as a high k gate dielectric, such as but not limited to hafnium oxide (e.g., $HfO_2$) and aluminum oxide (e.g., $Al_2O_3$), and a gate electrode 212, such as a metal gate electrode. A source region 214 and a drain region 216 are disposed on opposite sides of gate structure 208 as illustrated in FIG. 2.

Transistor 200 includes a drain field plate 220 located above drain region 216. Drain field plate 220 is separated from drain region 216 by a distance ($d_{DFP}$) as illustrated in FIG. 2. Drain field plate 220 may be separated from gate structure 208 by a distance dDG.

In an embodiment, source region 214 includes a source contact 224 and drain region 216 includes a drain contact 226. Source contact 224 may include a source semiconductor contact 228 and a source metal contact 230, and drain contact 226 may include a drain semiconductor contact 232 and a drain metal contact 234. In an embodiment as illustrated in FIG. 2, source semiconductor contact 228 and drain semiconductor contact 232 are formed from a III-N semiconductor, such as but not limited to indium gallium nitride (InGaN). In an embodiment, the III-N semiconductor has an N+ conductivity, such as, for example, greater than $1 \times 10^{18}$ atoms/cm$^3$. In an embodiment, the source metal contact 230 and the drain metal contact 234 include a metal, such as but not limited to tungsten. In an embodiment, drain field plate 220 is located laterally between drain metal contact 234 and gate structure 208 as shown in FIG. 2.

Transistor 200 may include a polarization layer 240 disposed on GaN layer 202. Polarization layer 240 may be formed from a group III-N semiconductor, such as but not limited to aluminum indium nitride (AlInN), aluminum indium gallium nitride (AlInGaN) and indium gallium nitride (InGaN). In an embodiment, polarization layer 240 is sufficiently thick in order to create a two-dimensional electron gas (2DEG) effect or layer 250 in the top surface of GaN layer 202 as illustrated in FIG. 2. In an embodiment, polarization layer 240 has a portion 242 beneath gate structure 208 which is thinner than portion 244 above source region 214 and drain region 216 so that a 2DEG layer or effect is not created in gallium nitride layer 202 beneath gate structure 208 as shown in FIG. 2. In an embodiment, polarization layer 240 is completely removed from under gate structure 208 and gate structure 208 is disposed directly on GaN layer 202. In and embodiment polarization layer 240 is multilayer film including a lower AlN film and an upper AlInN for example. In an embodiment, transistor 200 is operated in an enhancement mode.

Drain field plate 220 and gate structure 208 are disposed within dielectric layer 260 as illustrated in FIG. 2. In an embodiment, the top surface of drain field plate 220, is coplanar with the top surface of gate structure 208 as illustrated in FIG. 2. In an embodiment, the top surface of dielectric layer 260 is coplanar with the top surface of gate structure 208, and drain field plate 220 as illustrated in FIG. 2. In an embodiment, the top surface of source metal contact 230 and the top surface of drain metal contact 234 are coplanar with the top surface of gate structure 208 and the top surface of drain field plate 220.

Transistor 200 has a gate length (Lg) in a first direction extending between the source region 214 and the drain region 216 as shown in FIG. 2. A channel region is located in GaN layer 202 beneath gate structure 208 and between source region 214 and drain region 216. Transistor 200 has a gate width (Gw) in a direction perpendicular (in and out of the page) to the gate length (Lg) direction. In an embodiment, transistor 200 has a gate width (Gw) between 10 microns-100 microns. In an embodiment, drain field plate 220 extends the entire gate width (Gw) of transistor 200. In an embodiment gate structure 208 has a "T" shape as illustrated in FIG. 2. Gate structure may include an upper gate portion 213 and a lower gate portion 215. Upper gate portion 213 is distal from GaN layer 202 while lower gate portion 215 is nearer GaN layer 202. In an embodiment, lower gate portion 215 has a length (Lg) in the gate length direction which defines the gate length (Lg) of transistor 200. In an embodiment, upper gate portion 213 has length ($L_{ug}$) in the gate length direction which is at least two times, and in other embodiments at least three times, greater than the gate length (Lg) of lower gate portion 215. In an embodiment, as shown in FIG. 2 upper gate portion 213 extends a distance ($d_{UG}$) above drain region 216 which is greater than the distance $d_{DFP}$ that drain field plate 220 extends above drain region 216. A recessed drain field plate may provide improved control of the drain field. In an embodiment, a recessed drain field plate may exert a depletion effect on the 2DEG in the extended drain region. In an embodiment, upper gate portion 213 extends a distance ($d_{UG}$) above drain region 216 which is the same distance $d_{DFP}$ that drain field plate 220 extends above drain region 216. In an embodiment, gate dielectric 274 is disposed along the sidewalls and bottom of upper gate portion 213 and along the sidewalls and bottom of lower gate portion 215 as illustrated in FIG. 2.

In an embodiment, drain field plate 220 may be biased separately from a gate voltage (Vg) applied to gate structure 208. In an embodiment, drain field plate 220 may be biased to a potential different than Vss or ground. In an embodiment, drain field plate 220 may be biased differently than the voltage applied to source region 214. In an embodiment, drain field plate 220 may be biased differently than a voltage applied to drain region 216. In an embodiment, drain field plate 220 is not electrically connected to drain region 216.

In an embodiment, a pair of insulative spacers 270 are disposed along opposite sides of gate structure 208 as illustrated in FIG. 2. In an embodiment, insulative spacers 270 do not extend the entire height of gate structure 208. In an embodiment, insulative spacers 270 do not contact polarization layer 240 or GaN layer 202. In an embodiment, spacers 270 are formed beneath upper gate portion 213 and on sidewalls of lower gate portion 215 as illustrated in FIG. 2. In an embodiment, insulative spacers 270 are formed from an insulative material, such as but not limited to, silicon nitride and silicon oxynitride, which is different from the dielectric material of dielectric layer 260.

In an embodiment, a second dielectric layer 280 is disposed over dielectric layer 260. A plurality of conductive vias 282 may be disposed in dielectric 280 to enable independent electrical connections to and control of source region 214, drain region 216, drain field plate 220 and gate structure 208.

In an embodiment, a high k dielectric 272, such as but not limited to hafnium oxide (e.g., $HfO_2$) and aluminum oxide (e.g., $Al_2O_3$) may be disposed and on the sidewalls and bottom surface of drain field plate 220 as illustrated in FIG. 2. In an embodiment, high-k dielectric 272 is the same high-k dielectric material as gate dielectric layer 274 of gate structure 208.

Figure 3:
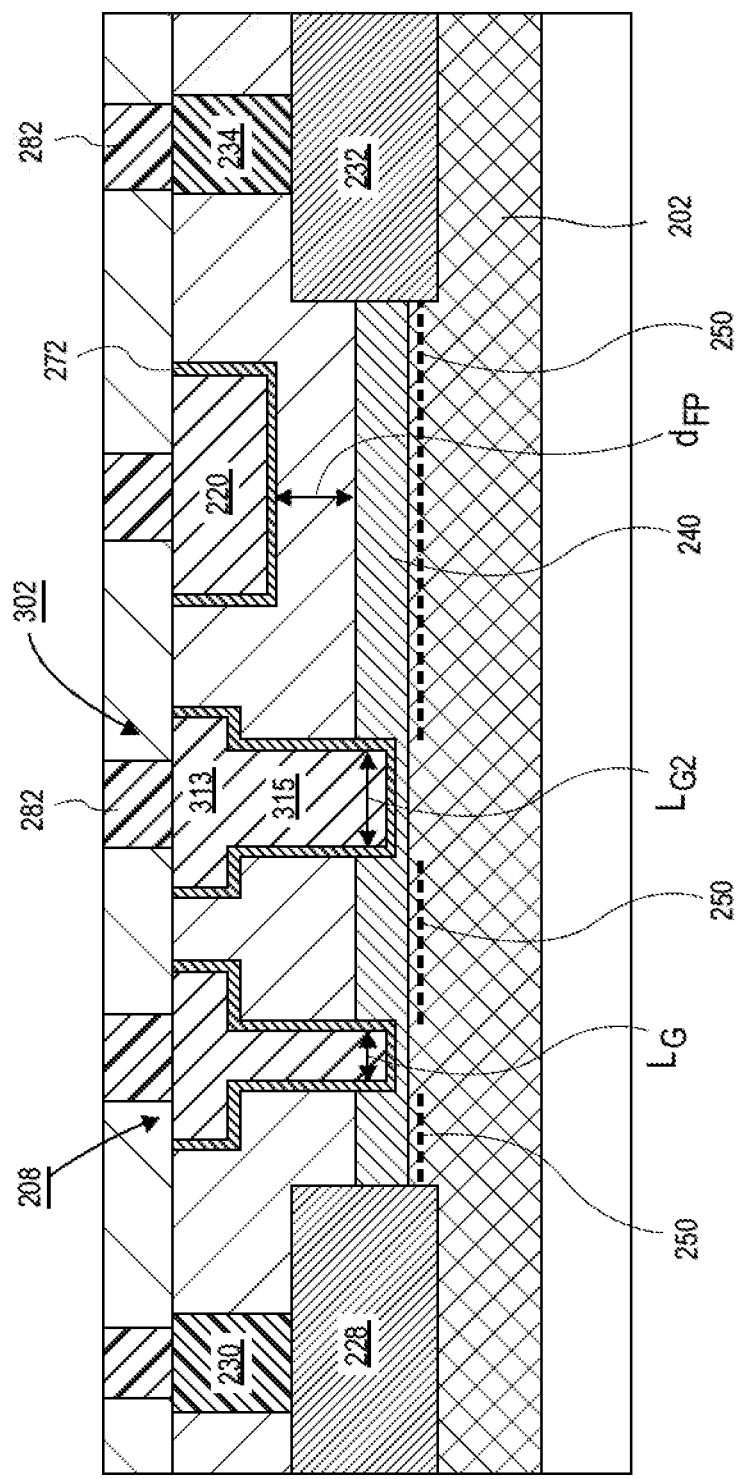
FIG. 3 illustrates a cross-sectional view of a GaN transistor having a drain field plate and having multiple gates, in accordance with embodiments of the present disclosure.

FIG. 3 illustrates a GaN transistor 300 having a drain field plate and multiple gates. Transistor 300 includes a second gate structure 302 above GaN layer 202 and between gate structure 208 and drain field plate 220 as illustrated in FIG. 3. Second gate structure 302 may be recessed into polarization layer 240 so that a 2DEG layer of effect is not formed under second gate structure 302 as illustrated in FIG. 3. Gate structure 302 may include a gate dielectric, such as a high-k gate dielectric and a gate electrode as described with respect to gate structure 208. In an embodiment, insulating spacers may be disposed on opposite sidewalls of gate structure 302 as illustrated in FIG. 3. Insulative spacers may not extend the entire height of gate structure 302 as illustrated in FIG. 3. In an embodiment, the second gate structure 302 has a larger gate length (Lg2) than the gate length (Lg) of gate structure 208. That is, in an embodiment, Lg2 is greater than Lg. In an embodiment, Lg2 is equal to Lg. In an embodiment, second gate structure 302 may have a "T" shape including an upper gate portion 313 and a lower gate portion 315 as illustrated in FIG. 3.

In an embodiment, two or more additional gate structures 302 may be disposed over GaN layer 202 and between gate structure 208 and drain field plate 220. In an embodiment, gate structure 208 and each of the additional gate structures 302 may be bias separately. In an embodiment, the multiple gates act as an RF voltage divider allowing each gate to be biased with a lower DC voltage. A single gate NMOS transistor may require a large negative gate voltage (Vg) to keep the transistor in an "OFF" state. In an embodiment, transistor 300 may be used in a cascoded power amplifier circuit. Transistor 300 may improve gain by reducing source resistance of the second gate. Having two gate electrodes may protect the corresponding gate oxides from increased voltages.

To provide further context, GaN high voltage transistors in the market are not scaled. GaN transistors in the market today utilize long channel gates and thick p-GaN gate stack that may not be suitable for scaling the transistor to smaller dimensions to improve performance and low resistances. Moreover, coarse lithography techniques that are used may be limited as the industry remains working in 4 inch manufacturing lines that do not have access to the latest lithographic tools and techniques.

In accordance with one or more embodiments of the present disclosure, a heterostructure employing, p-InGaN and p-AlGaN layers in the gate of the GaN transistor, in addition to p-GaN, to enable scaling of the gate stack, thus enabling the further scaling of transistor channel length to improve performance: lower on-resistance and higher drive current. Other enabling features such as p-(III-N) field plate, multi-gate structures and hybrid trench plus implant isolation techniques are also disclosed herein to enable scaling of high voltage GaN transistor solutions. Such features can enable the ultimate scaling of high voltage GaN transistors to provide the highest performance in the smallest possible footprint.

In accordance with an embodiment of the present disclosure, a high voltage GaN transistor technology enables power delivery solutions that are more efficient than what is possible today. Servers and graphics products are powered by power delivery solutions with input voltages ranging between 48V to 72V. Discrete GaN transistors are used to step this high input voltage down to 5V on the board so that Si transistors can be used in the subsequent power stages to convert the voltage to 1.8V and another stage to further down convert to 1V to 0.6V. Many stages of conversion are required using Si technology because at each stage, a different Si transistor technology is used. Dissimilar discrete technologies must thus be made to work together on the board or in bulky thick packages. GaN technology is unique in that it is the only technology that can be used across the entire power delivery value chain from 72V down to 0.6V. With a high voltage GaN transistor technology, power can ultimately be delivered at 48V to the socket of a microprocessor. Many benefits can be realized: the current level (I) on the board can be reduced, power dissipation (about 12) on the board can be significantly reduced, form factor can be significantly reduced (at least 10× shrink or more).

Embodiments of the disclosure relate to gallium nitride (GaN) transistors having multiple threshold voltages and their methods of fabrication. A GaN transistor, in accordance with embodiments, includes a gallium nitride layer above a substrate, such as a silicon monocrystalline substrate. A gate stack is disposed above the GaN layer. A source region and a drain region are disposed on opposite sides of the gate stack. A polarization layer including a group III-N semiconductor is disposed on the GaN layer and beneath the gate stack. The polarization layer may have a first thickness, including a zero thickness, beneath a first gate portion of the gate stack and a second thickness greater than the first thickness beneath a second gate portion of the gate stack. The thickness of the polarization layer or lack of a polarization layer beneath the gate stack affects the threshold voltage of the overlying portion of the gate stack. By providing different thicknesses of the polarization layer beneath different portions of the gate stack, a transistor may be engineered to have two or more different threshold voltages. In an embodiment, a transistor has a threshold voltage in the range of 1V to −6V. A GaN transistor having multiple threshold voltages may be fabricated as a planar transistor or a nonplanar transistor. In embodiments of the present disclosure, a GaN transistor having two or more threshold voltages may be used to create a hybrid class A+AB power amplifier with improved linearity.

Figure 4A:
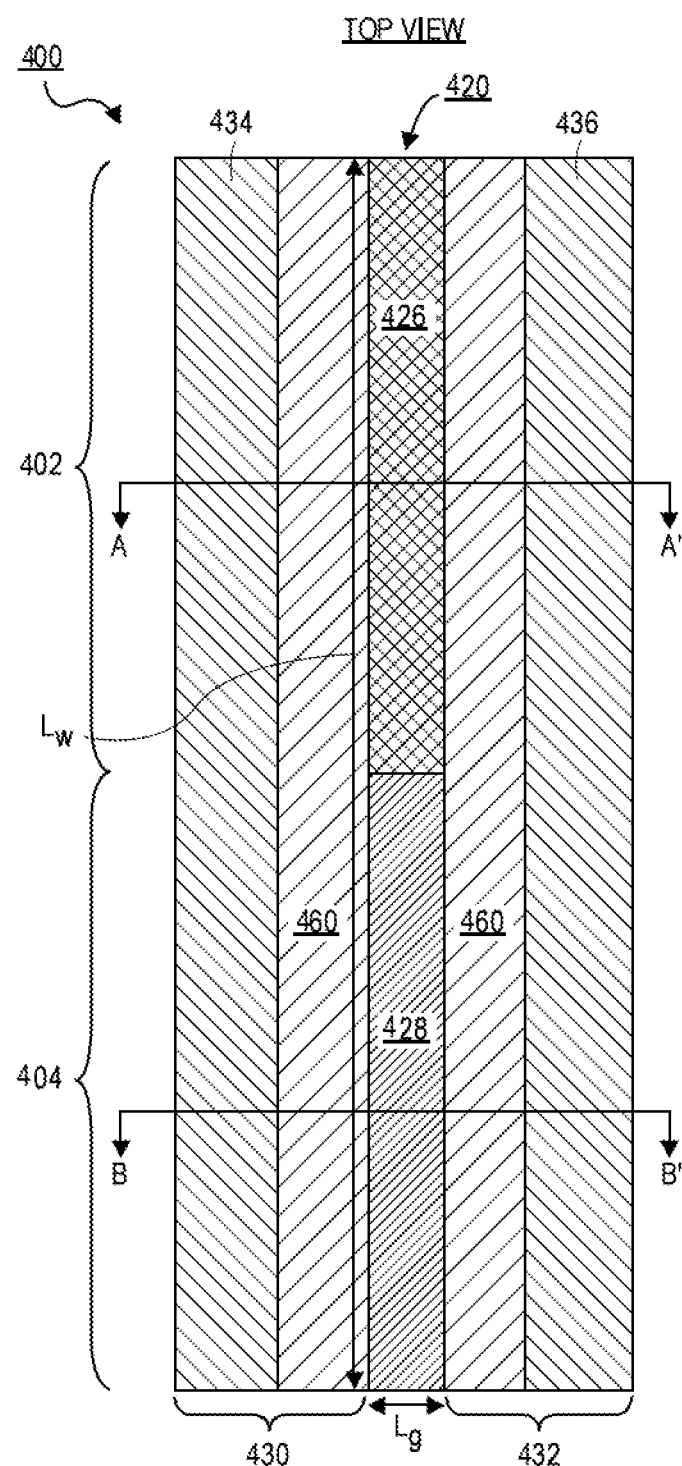
FIGS. 4A-4C illustrate a GaN transistor in accordance with embodiments of the present disclosure.
Figure 4B:
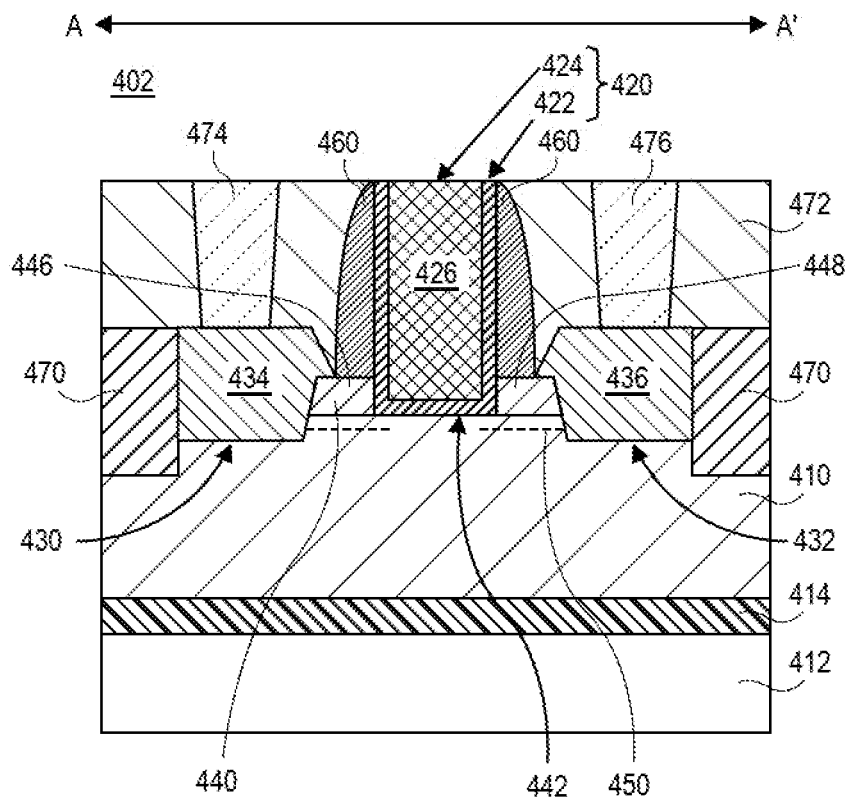
Figure 4C:
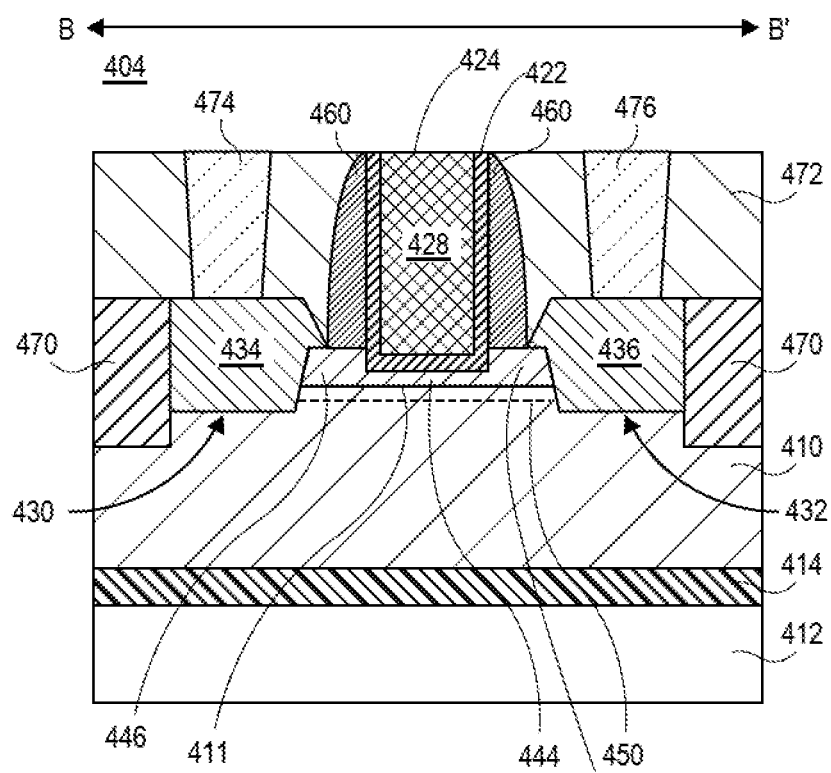

FIGS. 4A-4C illustrate a GaN transistor 400 in accordance with embodiments of the present disclosure. FIG. 4A is a top down view illustrating GaN transistor 400 while FIG. 4B is as cross-sectional view taken through a first portion 402 of transistor 400 and FIG. 4C is a cross-sectional view taken through a section of portion 404 of transistor 400. Transistor 400 includes a gallium nitride (GaN) layer 410 disposed above a substrate 412, such as but not limited to a silicon monocrystalline substrate. A buffer layer 414, such as an aluminum nitride (AlN) layer, may be disposed between substrate 412 and GaN layer 410. GaN layer 410 provides a channel layer for transistor layer 400. A gate stack 420 is disposed above the GaN layer 410 as illustrated in FIGS. 4B and 4C. The gate stack may include a gate dielectric 422 and a gate electrode 424 with the gate dielectric 422 between the gate electrode 424 and GaN layer 410. In an embodiment, the gate dielectric 422 is a high-k gate dielectric such as but not limited to a hafnium oxide (e.g., $HfO_2$) or aluminum oxide (e.g., $Al_2O_3$) gate dielectric layer.

A source region 430 and a drain region 432 may be disposed on opposite sides of gate stack 420 as illustrated in FIGS. 4A-4C. In an embodiment source region 430 and includes a group III-N semiconductor contact 434, such as but not limited to InGaN, and drain region 432 includes a group III-N semiconductor contact 436. In an embodiment, group III-N semiconductor contacts 434 and 436 are a single crystalline III-N semiconductor, and may be doped to an N+ conductivity (e.g., greater than 1E18 concentration) with, e.g., silicon. Transistor 400 has a gate length (Lg) which extends in a first direction between source region 430 and drain region 432. When transistor 400 is in an "ON" state current flows between source region 430 and drain region 432 in the first direction. Transistor 400 has a gate width (Gw) in a second direction, perpendicular to the first direction or to the gate length direction, and parallel to the source and drain regions 430 and 432 as illustrated in FIG. 4A. In an embodiment, the gate width of transistor 400 is between 10 and 100 microns.

Transistor 400 includes a polarization layer 440. In an embodiment, polarization layer 440 is a group III-N semiconductor, such as but not limited to a group III-N semiconductor including aluminum, gallium, indium and nitrogen or $Al_xIn_yGa_{1-x-y}N$ (0<x<=1, 0<=y<1). In an embodiment, x=0.83 and y=0.17, where $Al_{0.83}In_{0.17}N$ is lattice-matched to GaN. In an embodiment, the polarization layer 440 is disposed directly on a surface 411 of GaN layer 410 which is a (0001) plane or a C-plane of gallium nitride. Depending on the composition and thickness of polarization layer 440, polarization layer 440 may create a 2DEG layer 450 in the top surface of GaN layer 410 as illustrated in FIGS. 4B and 4C.

In an embodiment of the present disclosure, a first portion 402 of transistor 400 has a first gate portion 426 of gate stack 420 disposed over a first portion 442 of polarization layer 440 having a first thickness, which may be a zero thickness, while a second portion 404 of transistor 400 has a second gate portion 428 of gate stack 420 disposed over a second portion 444 of polarization layer 440 having a second thickness, wherein the second thickness is greater than the first thickness. The difference in thicknesses between the first portion 442 and the second portion 444 of polarization layer 440 creates a difference in the threshold voltages for the first gate portion 426 of gate stack 420 and the second gate portion 428 of gate stack 420 where the threshold voltage (VT1) of the first gate portion 426 is greater than the threshold voltage (VT2) of the second gate portion 428. In an embodiment, the first threshold voltage (VT1) is greater than the second threshold voltage (VT2) by an amount in the range of 100 mV to 9V. In an embodiment, the first threshold voltage (VT1) is greater than the second threshold voltage (VT2) by greater than 2V.

In a specific embodiment, as shown in FIGS. 4B and 4C, the first portion 442 of polarization layer 440 has a thickness of zero. That is, there is no polarization layer 440 beneath the first gate portion 426 of gate stack 420 and the first gate portion 426 is disposed directly on GaN layer 410 as illustrated in FIG. 4B. Second portion 444 of polarization layer 440 has a non-zero thickness beneath the second gate portion 428 of gate stack 420. In an embodiment, second portion 444 of polarization layer 440 is sufficiently thick to create a 2DEG layer in the top surface of GaN layer 410 beneath second portion 428 of gate stack 420. In this way, the first gate portion 426 of gate stack 420 has a threshold voltage (VT1) which is greater than the threshold voltage (VT2) of the second gate portion 428 of gate stack 420. In an alternative embodiment, first portion 442 of polarization layer 440 has a zero thickness, and the second portion has a non-zero thickness, which is not sufficiently thick to create a 2DEG layer in GaN layer 410 beneath second gate portion 428 of gate stack 420. Although, a 2DEG is not formed beneath the second gate portion 428 of gate stack 420 in an embodiment, the second portion 428 of gate stack 420 may still have a lower threshold voltage (VT2) than the threshold voltage (VT1) of the first gate portion 426 of gate stack 420 disposed directly on GaN layer 410.

In the embodiment, the first portion 442 and the second portion 444 of polarization layer 440 both have a non-zero thickness. In an embodiment, the first portion 442 has a first non-zero thickness and a second portion 444 has a second non-zero thickness greater than the first thickness, wherein the first portion 442 is not sufficiently thick to create a 2DEG layer in GaN layer 410 beneath first gate portion 426 and wherein the second portion 444 of polarization layer 440 is also not sufficiently thick to create a 2DEG layer in GaN layer 410 beneath second gate portion 428. In yet another embodiment, the second portion 444 of polarization layer 440 is thicker than the first portion 442 of polarization layer 440 and the first portion 442 and the second portion 444 are each sufficiently thick to create a 2DEG layer in GaN layer 410 beneath first gate portion 426 and second gate portion 428, respectively. In an embodiment, the second portion 444 of polarization layer 440 is approximately 2-3 times thicker than the first portion 442 of polarization layer 440. In a specific embodiment, the first portion 442 of polarization layer 440 includes a 1 nanometer AlN layer on the GaN layer 410 and a 1 nanometer AlInN layer on the 1 nanometer AlN layer, and the second portion 444 of polarization layer 440 includes a 1 nanometer AlN layer on the GaN layer 410 and a 3 nanometer AlInN layer on the 1 nanometer AlN layer. In an embodiment, in either case, the AlInN layer includes $Al_{0.83}In_{0.17}N$.

In another embodiment, first portion 442 of polarization layer 440 has a non-zero thickness that is insufficient to create a 2DEG layer in GaN layer 410 beneath first gate portion 426 and wherein the second portion 444 of polarization layer 440 has a thickness greater than the thickness of the first polarization layer 442 and is sufficient to create a 2DEG layer in GaN layer 410 beneath second gate portion 428.

It is to be appreciated, in embodiment of the present disclosure, polarization layer 440 may have a third portion beneath a third gate portion wherein the third portion of the polarization layer 440 has a thickness greater than the thickness of the second portion 444 of polarization layer 440 which is yet thicker than the first portion 442 of polarization layer 440. In this way, a transistor having three different threshold voltages may be obtained. A similar technique may be practiced to create a GaN transistor with four or more threshold voltages, if desired.

In an embodiment, transistor 400 includes a pair of insulative sidewall spacers 460 disposed on opposite sides of gate stack 420 as illustrated in FIGS. 4B and 4C. Sidewall spacers may be formed from any well-known material, such as but no limited to silicon oxide, silicon nitride, and silicon oxynitride. One of the sidewall spacers of the pair of sidewall spacers 460 is disposed on a source portion 446 of polarization layer 440 between gate stack 420 and source III-N semiconductor contact 434. The other sidewall spacer of the pair of sidewall spacers 460 is disposed on a drain portion 448 of polarization layer 440 disposed between gate stack 420 and drain III-N semiconductor contact 436. In an embodiment, source polarization layer 446 creates a 2DEG layer 450 in the top surface of GaN layer 410 and drain polarization layer 448 creates a 2DEG layer 450 in the top surface of GaN layer 410 as illustrated in FIGS. 4B and 4C. In embodiments of the present disclosure, source polarization layer 446 and drain polarization layer 448 have a thickness greater than the thickness of the second portion 444 of polarization layer 440 and greater than the thickness of the first portion 442 of polarization layer 440 which may be a zero thickness.

In an embodiment of the present disclosure, the first transistor portion 402 and the second transistor portion 404 have the same gate width. In other embodiments, the first transistor portion 402 has a greater or smaller gate width than second transistor portion 404. In this way, the amount of current provided by the first transistor portion may differ from the amount of current provided by the second transistor portion 404.

In embodiments of the present disclosure, isolation regions 470 may be formed in GaN layer 410. Isolation regions 470 may surround transistor 400 to isolate transistor 400 from other devices manufactured in GaN 410 and/or substrate 412. An interlayer dielectric 472, such as but not limited to, silicon dioxide and carbon doped silicon oxide, may be disposed over transistor 400. Contacts 474 and 476, such as metal contacts, may be disposed in dielectric 472 to create electrical contacts to source III-N semiconductor contact 434 and to drain III-N semiconductor contact 436, respectively, as illustrated in FIGS. 4B and 4C.

Figure 5:
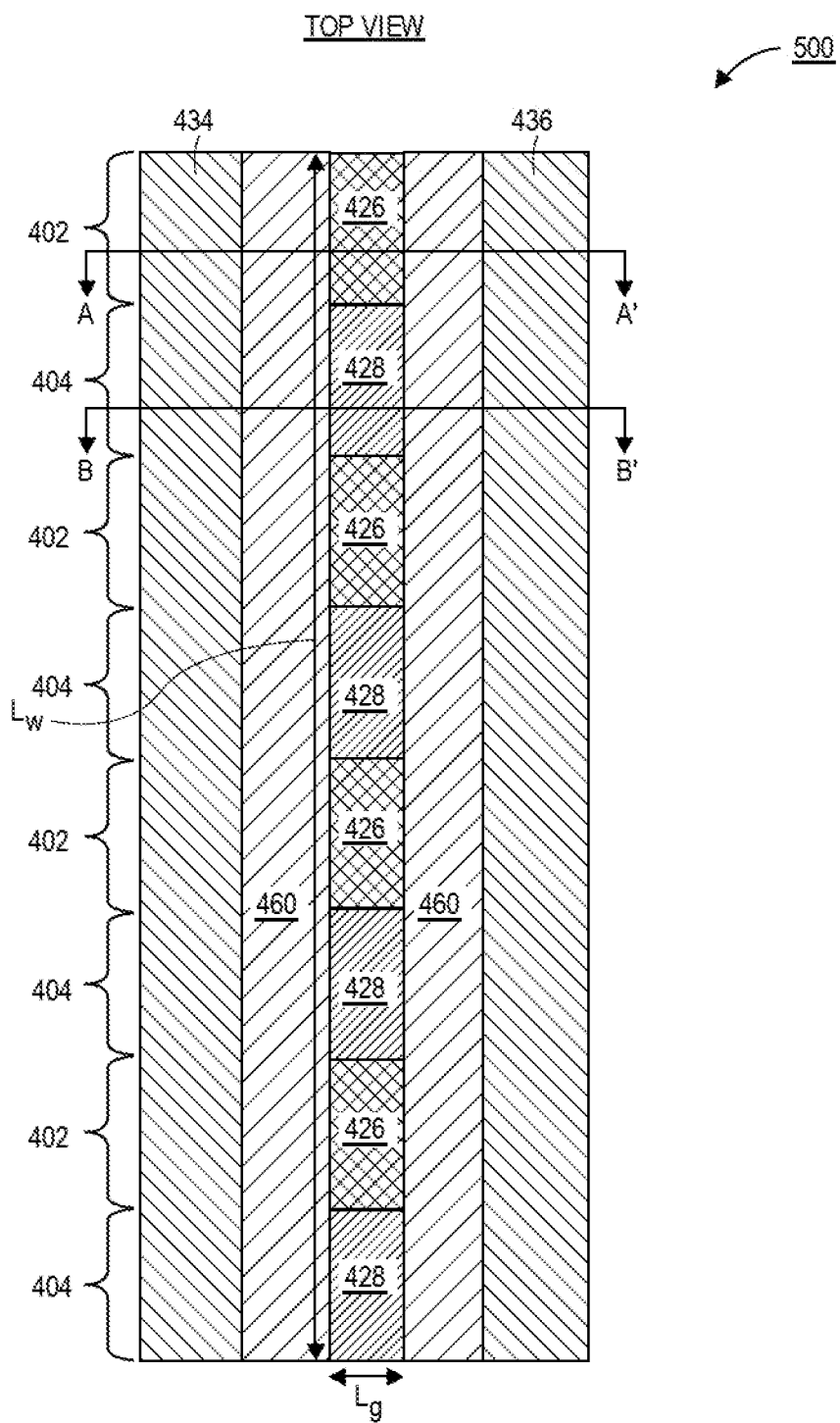
FIG. 5 illustrates a GaN transistor having multiple threshold voltages in accordance with an embodiment of the present disclosure.

FIG. 5 illustrates a GaN transistor 500 having multiple threshold voltages in accordance with an embodiment of the present disclosure. GaN transistor 500 includes a plurality of first transistor portions 402 and a plurality of second transistor portions 404 along the gate width (Gw) direction of transistor 500 as illustrated in FIG. 5. Each of the first transistor portions 402 and each of the second transistor portions 404 may include transistor structures as illustrated and described with respect to FIGS. 4B and 4C, respectively. That is, in an embodiment, each first transistor portion 402 of the plurality of first transistor portions includes a first portion 442 of polarization layer 440 having a first thickness, including possibly a zero thickness, and each second transistor portion 404 of the plurality of second transistor portions includes a second portion 444 of polarization layer 440 having a second thickness wherein the second thickness is greater than the first thickness. In an embodiment, the first transistor portions 402 and the second transistor portions 404 of GaN transistor 500 alternate or interleave with one another along the gate width (Gw) direction of FIG. 5. In an embodiment, transistor 500 includes two first transistor portions 402 and two second transistor portion 404. In another embodiment, transistor 500 includes three first transistor portions 402 and three second transistor portions 404. In yet another embodiment, transistor 500 includes three or more first transistors portions 402 and three or more second transistor portions 404. In embodiments, transistor 500 has more first transistor portions 402 than second transistor portions 404. In yet embodiment, transistor 500 has more second transistor portions 404 than first transistor portions 402. In an embodiment, interleaving provides a plurality of parallel channels for transistor 500.

Figure 6:
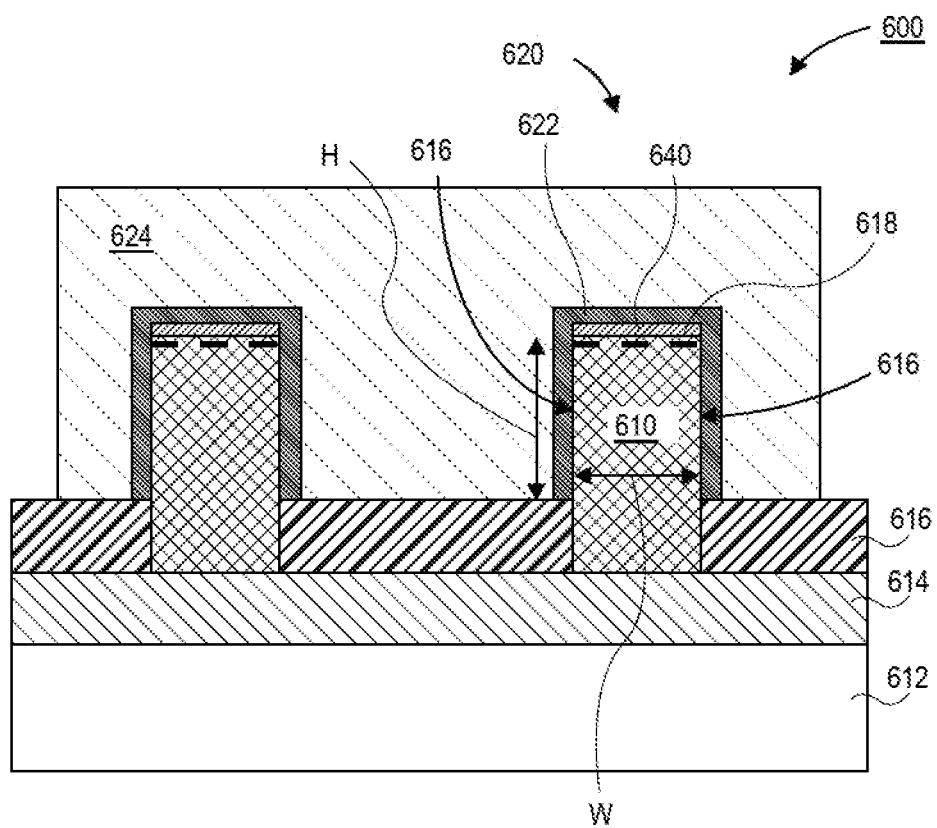
FIG. 6 illustrates a cross-sectional view of a nonplanar or tri-gate GaN transistor having multiple threshold voltages in accordance with embodiments of the present disclosure.

FIG. 6 illustrates a cross-sectional view of a nonplanar or tri-gate GaN transistor 600 having multiple threshold voltages in accordance with embodiments of the present disclosure. Transistor 600 includes a GaN fin 610 disposed above a substrate, such as but not limited to a monocrystalline silicon substrate, silicon carbide substrate, or an aluminum oxide substrate. A buffer layer 614 may be disposed between GaN fin 610 and substrate 612. Fin 610 has a pair of laterally opposite sidewalls 616 and a top surface 618 between the laterally opposite sidewalls. In an embodiment, top surface 618 of GaN fin 610 is a (1000) plane or a c-plane of GaN. An oxide layer, such as an oxide of a shallow trench isolation (STI) may be disposed above substrate 612 and may surround a bottom portion of fin 610, so that an upper portion of fin 610 extends above oxide 616 as illustrated in FIG. 6.

A polarization layer 640 is disposed on the top surface 618 of fin 610. In an embodiment, polarization layer 640 is a III-N semiconductor material, such as but not limited to AlGaInN, AlGaN, and AlInN. In an embodiment polarization layer 640 is not formed on sidewall 616 of fin 610. A gate stack 620 is disposed over polarization layer 640 on the top surface 618 of fin 610 and is disposed over the sidewalls 616 of fin 610 as illustrated in FIG. 6. Gate stack 620 may include a gate dielectric 622, such as but not limited to hafnium oxide (e.g. $HfO_2$) or aluminum oxide (e.g. $Al_2O_3$) and a gate electrode 624 such as a metal gate electrode. Gate dielectric 622 may be disposed between gate electrode 624 and sidewalls 616 of gate electrode 624 and between gate electrode 624 and polarization layer 640 on the top surface of GaN fin 610. A source region and a drain region (not shown) may be disposed on opposite sides (into and out of the page) of the gate stack 620 as is well-known in the art. The source and drain regions each may include a group III-N semiconductor contact, such as but not limited to InGaN.

In an embodiment, polarization layer 640 is of a sufficient thickness to create a 2DEG layer in the top surface of fin 610 as illustrated in FIG. 6. In an alternative embodiment, polarization layer 640 has a thickness which is insufficient to create a 2DEG layer in the top surface of fin 610, however, is of a sufficient thickness in order to provide a different threshold voltage for the portion of the gate stack 620 over the top surface 618 of fin 610 relative to the threshold voltage of the gate stack 620 adjacent to the sidewalls 616 of fin 610. In either case, transistor 600 has two different threshold voltages, a first threshold voltage (VT1) associated with a portion of the gate stack 620 over/adjacent to the sidewalls 616 of fin 610 and second threshold voltage (VT2), such as a lower threshold voltage, associated with the portion of the gate stack 620 over polarization layer 640 and top surface 618 of fin 610. The width (W) of and the height (H) of the portion of fin 610 may be chosen to create the desired amount of current provided by the top surface 618 of fin 610 relative to the sidewalls 616 of fin 610. In an embodiment, an additional fin or fins including a top polarization layer may be included to increase the current carrying capability of transistor 600, an example of which is shown in FIG. 6.

It is to be appreciated that, whether fabricated on bulk substrates or on insulator substrates, other functional devices may be fabricated along with transistor devices. In an example, embodiments of the present disclosure relate to semiconductor integrated circuits and more particularly to group III-V semiconductor fuses and their methods of fabrication.

In embodiments, a fuse includes a III-V semiconductor layer, such as gallium nitride (GaN), formed over a substrate, such as a silicon monocrystalline substrate. An oxide layer is located in a trench in the III-V semiconductor layer. The fuse further includes a first contact located on the III-V semiconductor layer on a first side of the trench and a second contact located on the III-V semiconductor layer on a second side of the trench, wherein the first side of the trench is opposite to the second side of the trench. In an embodiment, the first and second contacts are formed from a III-V semiconductor, such as indium, gallium and nitrogen (InGaN). In an embodiment, the first and second contacts are formed of a III-V semiconductor which is different than the III-V semiconductor layer in which the trench is formed. In an embodiment, the first and second contacts are single crystalline. A filament is disposed above the oxide layer in the trench and is in contact with the first and second contacts. In an embodiment, the filament is an III-V semiconductor and has a polycrystalline structure. In an embodiment, the first and second contact and the filament are N+ doped.

A III-V semiconductor fuse is not based on thermally accelerated metal electromigration and, as such may not require very thin and narrow metal interconnects as necessary with conventional metal fuses. In embodiments of the present disclosure, the fuse may be used as a programmable, read only memory to burn in calibration data, such as bias offsets, bias temperature compensation, and/or temperature sensor offsets. The fuse may also be used to store manufacturing identification (ID) information.

In embodiments of the present disclosure, the fuse may be fabricated alongside and simultaneous with a III-V semiconductor transistor, such as a GaN transistor, formed on the III-V layer disposed over the substrate. In an embodiment, a source/drain regrowth module used to form source and drain regions for a III-V transistor is also used to create the first contact, the second contact and the filament of the III-V fuse. In an embodiment, a patterned polycrystalline film used to form a sacrificial gate electrode for the III-V transistor is also used to form a seeding material for the filament of the III-V semiconductor fuse. In an embodiment of the present disclosure, the state of the fuse or the states of a plurality of fuses is/are used to control or determine the bias voltage applied to the III-V transistor.

Figure 7A:
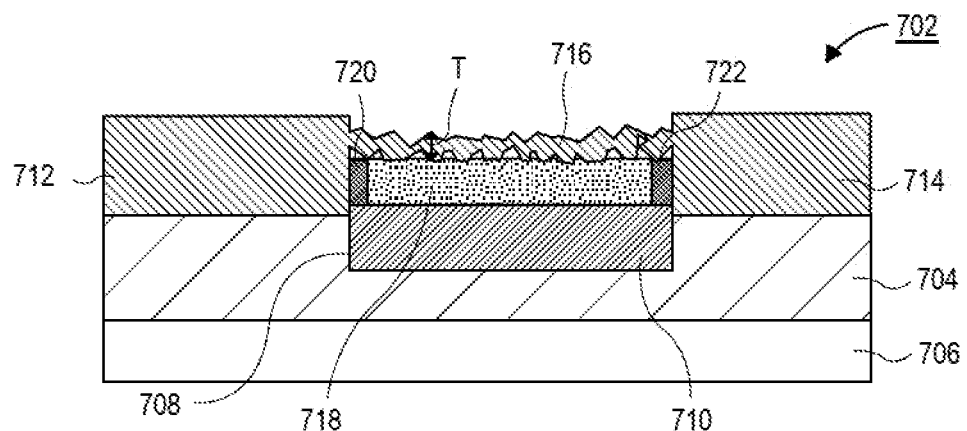
FIG. 7A and FIG. 7B illustrate a III-V fuse in accordance with an embodiment of the present disclosure.
Figure 7B:
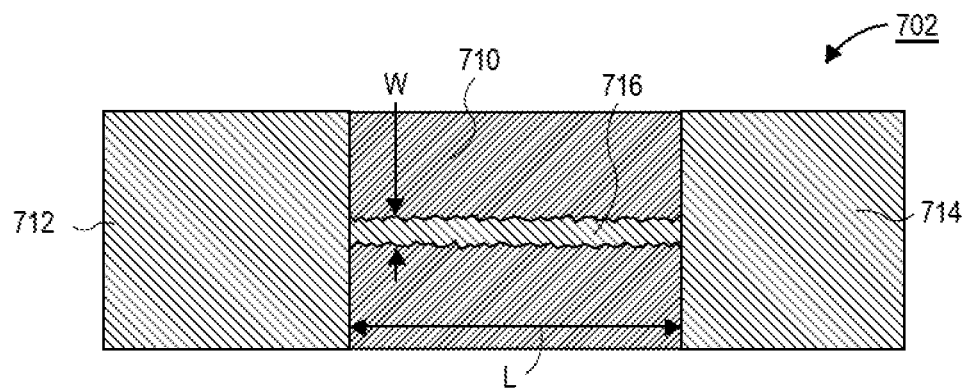

FIG. 7A and FIG. 7B illustrate a III-V fuse 702 in accordance with an embodiment of the present disclosure. FIG. 7A is a cross-sectional view of fuse 702 while FIG. 7B is an overhead view of fuse 702. In an embodiment, fuse 702 is disposed over a group III-V semiconductor layer on a substrate 706, such as a monocrystalline silicon substrate. In an embodiment, group III-V semiconductor layer 704 is a group III nitride semiconductor and in a specific embodiment may be GaN. A trench 708 is formed in III-V semiconductor layer 704. An oxide layer 710 is disposed in the trench 708. A first contact 712 is located on a first side of trench 708 and a second contact 714 is located on a second side of trench 708 wherein the second side is opposite the first side. The first contact 712 and the second contact 714 are a III-V semiconductor, such as indium gallium nitride ($In_xGa_{1-x}N$, $0<x<1$). In an embodiment, first contact 712 and the second contact 714 are a different group III-V semiconductor than the group III-V semiconductor layer 704. In an embodiment of the present disclosure, the first contact 712 and second contact 714 are formed from indium gallium nitride (InGaN) semiconductor, and the group III-V semiconductor of layer 704 is a gallium nitride (GaN) layer. In an embodiment of the present disclosure, first contact 712 and second contact 714 have a single crystalline or near single crystalline structure. In an embodiment of the present disclosure, first contact 712 and second contact 714 are formed in recesses disposed in the group III-V semiconductor layer 704 so that the bottom of first contact 712 and second contact 714 are beneath the top surface of oxide layer 710.

A filament 716 is disposed above oxide layer 710 in trench 708 and is in direct electrical and physical contact with first contact 712 and second contact 714. Oxide layer 710 isolates filament 716 from III-V semiconductor layer 704. Filament layer 716 has a length (L), a width (W), and a thickness (T) as illustrated in FIGS. 7A and 7B. In an embodiment, filament 716 is a group III-V semiconductor, such as indium, gallium nitride ($In_xGa_{1-x}N$ $0<x<1$). In an embodiment, the filament 716 has a polycrystalline grain structure. In an embodiment, first contact 712, second contact 714, and filament 716 each have an N+ conductivity, e.g., greater than 1E18 atoms/cm$^3$. In an embodiment, filament 716 is a same material as the first contact 712 and second contact 714. In another embodiment, filament 716 is a different material than the first contact 712 and second contact 714.

In an embodiment, fuse 702 includes a seed layer 718 located between filament layer 716 and oxide layer 710. Filament 716 may be disposed directly on seed layer 718 and seed layer 718 may be disposed directly on oxide layer 710. In an embodiment, seed layer 718 is a polycrystalline film, such as but not limited polycrystalline silicon or polycrystalline silicon germanium. In an embodiment, seed layer 718 is undoped or only lightly doped. In an embodiment, fuse 702 includes a first insulating sidewall spacer 720 located between a first side of seed layer 718 and first contact 712 and a second insulating sidewall spacer 722 located between a second side of seed layer 718 and second contact 714 as illustrated in FIG. 7A. Sidewall spacers 720 and 722 isolate seed layer 718 from first contact 712 and second contact 714, respectively. Insulating sidewall spacers 720 and 722 may be formed from an insulating material, such as but not limited to silicon oxide, silicon oxynitride, and silicon nitride.

In an alternative embodiment, filament 716 is formed directly on oxide layer 710. In such an embodiment, a groove or a trench patterned in oxide layer 710 may act as a seeding structure for filament 716.

Figure 7C:
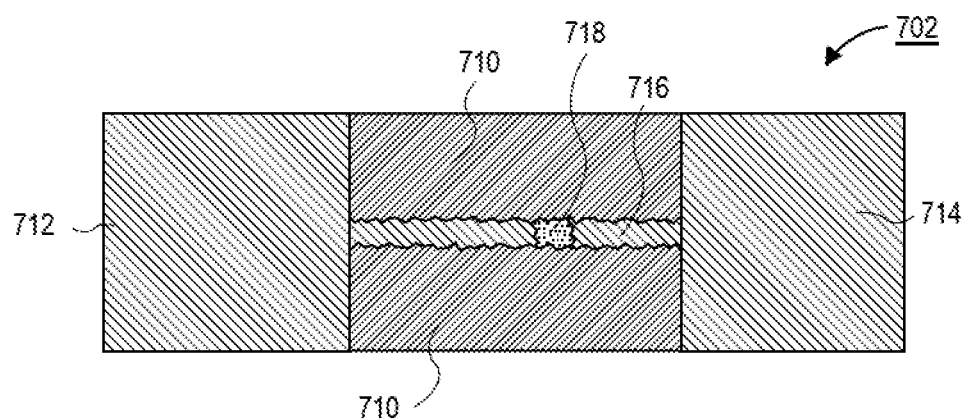
FIG. 7C illustrates a fuse which is in an open state or a "blown" state in accordance with an embodiment of the present disclosure.

Fuse 702 has two states, a first low resistive state and a second open or highly resistive state. The low resistive state is shown in FIGS. 7A and 7B where filament 716 is continuous and unbroken between first contact 712 and second contact 714. The resistive value of fuse 702 in the low resistive state is largely determined by the width, thickness, and length of filament 716. Fuse 702 has a second state which is an open state or a "blown" state wherein the fuse has a void or opening formed completely through filament 716 as illustrated in FIG. 7C so that current does not flow through the filament 716 between first contact 712 and second contact 714 when a voltage is placed between first contact 712 and second contact 714. Fuse 702 can be programmed from a low resistive state to an open state or a "blown" by applying a sufficiently large current or voltage between first contact 712 and second contact 714 so that filament 716 is blown.

In an embodiment, substrate 706 includes a plurality of fuses 702, such as several hundred fuses 702, to provide a non-programmable memory to store information, such as but not limited to calibration information, bias offset information and manufacturing identification information for circuits fabricated on substrate 702.

In a third aspect, complementary metal oxide semiconductor (CMOS) devices are described. It is to be appreciated that structures ranging from planar devices, finFET devices, nanowire devices, and/or nanoribbon devices can be used. In any case, such CMOS devices may be fabricated on a germanium-containing structure portion of the substrate 150 described in association with FIGS. 1A-1D.

Figure 8:
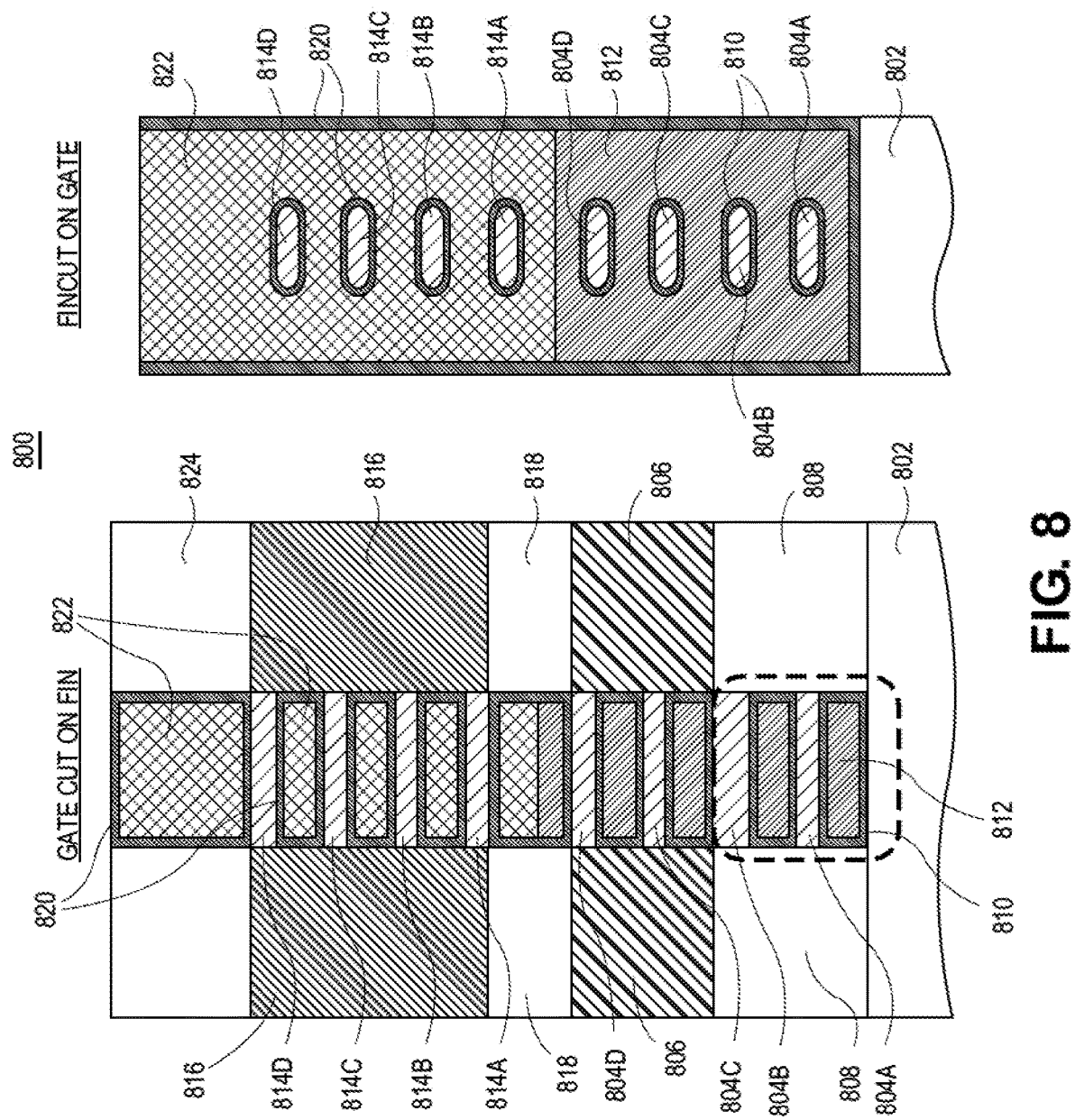
FIG. 8 illustrates cross-sectional views representing a stacked gate-all-around integrated circuit structure, in accordance with an embodiment of the present disclosure.

As an exemplary and somewhat exotic CMOS structure suitable for co-integrating with a GaN device, FIG. 8 illustrates cross-sectional views representing a stacked gate-all-around integrated circuit structure, in accordance with an embodiment of the present disclosure.

Referring to FIG. 8, a CMOS integrated circuit structure 800 is formed above a substrate 802 and includes a lower PMOS region and an upper NMOS region. The lower PMOS region includes stacked nanoribbons 804A, 804B, 804C and 804D. P-type source or drain structures 806 are adjacent (at least some of) the stacked nanoribbons 804A, 804B, 804C and 804D and above an insulating structure 808. A lower gate structure includes a gate dielectric layer 810 having a P-type gate electrode 812 thereon. The upper NMOS region includes stacked nanoribbons 814A, 814B, 814C and 814D. N-type source or drain structures 816 are adjacent the stacked nanoribbons and above an insulating structure 818. An upper gate structure includes a gate dielectric layer 820 having an N-type gate electrode 822 thereon. Spacers 824 may be adjacent to an uppermost portion of the upper gate structure.

In one embodiment, not depicted, the P-type source or drain structures 806 are adjacent all of the stacked nanoribbons 804A, 804B, 804C and 804D, and all nanoribbons 804A, 804B, 804C and 804D are active. However, in other embodiments, channel depopulation involving source or drain structure tuning is implemented in some structures to reduce a channel count, e.g., in the PMOS region relative to other structures fabricated on a silicon substrate. For example, referring again to FIG. 8, all of the upper stacked nanoribbons 814A, 814B, 814C and 814D (e.g., in this case 4) are coupled to the N-type source or drain structures 816. However, only the upper two stacked nanoribbons 804C and 804D are coupled to the P-type source or drain structures 806, while the lower two stacked nanoribbons 804A and 804B are not coupled to the P-type source or drain structures 806 (as indicated in the dashed box around nanoribbons 804A, 804B). The resulting structure effectively depopulates two of the four channel regions of the P-type portion of the CMOS integrated circuit structure 800. However, source or drain 806 depth engineering is required to fabricate CMOS integrated circuit structure 800. It is to be appreciated that although the illustrative example of four upper wires and two lower wires and effectively two depopulated nanowires is depicted and described above, it is to be appreciated that all such wire counts may be varied.

Figure 9:
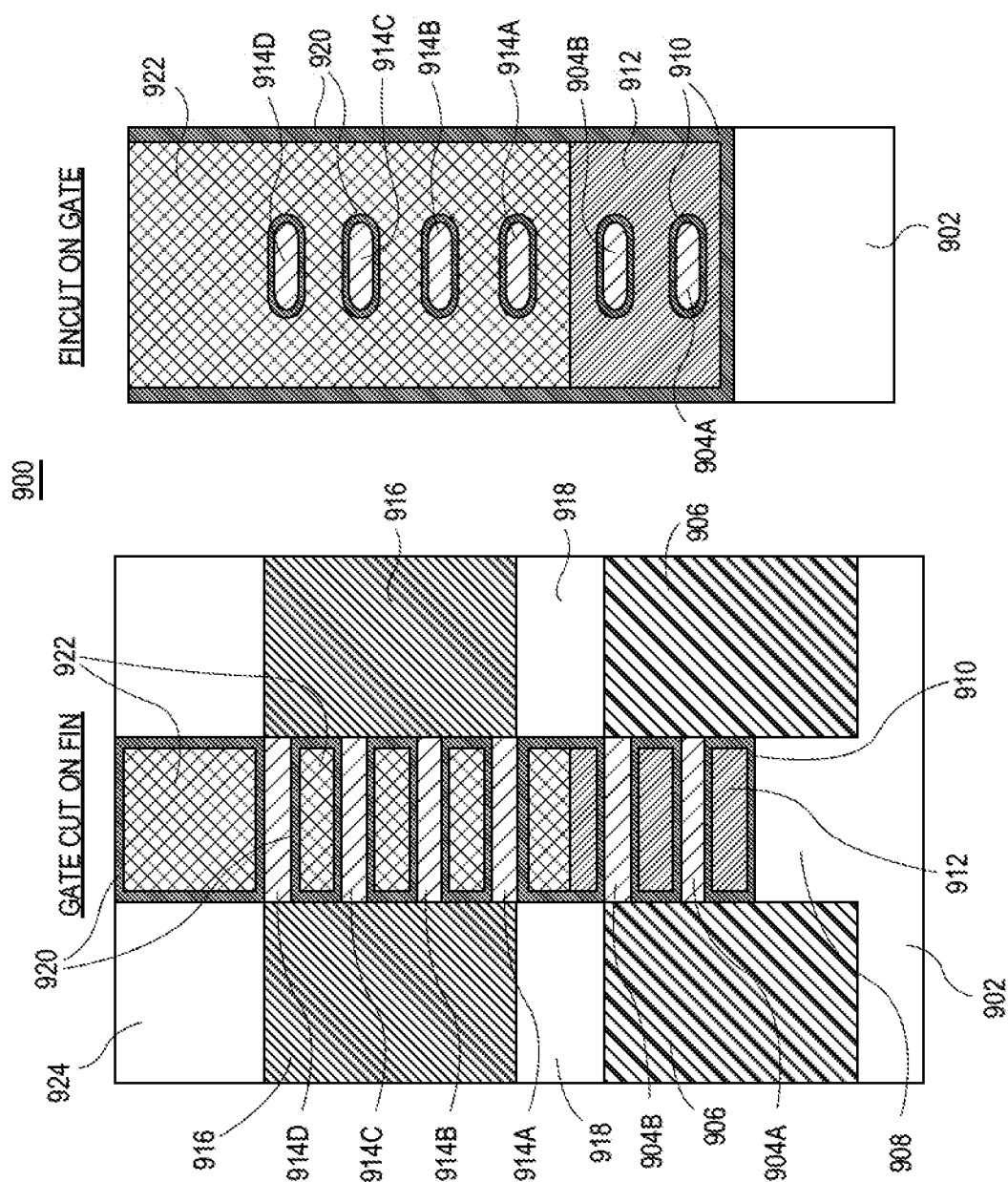
FIG. 9 illustrates cross-sectional views representing a stacked gate-all-around integrated circuit structure having a depopulated channel structure, in accordance with an embodiment of the present disclosure.

As a comparison of channel depopulation involving channel count tuning, and as another exemplary CMOS structure suitable for co-integrating with a GaN device, FIG. 9 illustrates cross-sectional views representing a stacked gate-all-around integrated circuit structure having a depopulated channel structure, in accordance with an embodiment of the present disclosure.

Referring to FIG. 9, a CMOS integrated circuit structure 900 is formed above a substrate 902 and includes a lower PMOS region and an upper NMOS region. The lower PMOS region includes stacked nanoribbons 904A and 904B above a raised substrate portion 908. P-type source or drain structures 906 are adjacent the stacked nanoribbons. A lower gate structure includes a gate dielectric layer 910 having a P-type gate electrode 912 thereon. The upper NMOS region includes stacked nanoribbons 914A, 914B, 914C and 914D. N-type source or drain structures 916 are adjacent the stacked nanoribbons and above an insulating structure 918. An upper gate structure includes a gate dielectric layer 920 having an N-type gate electrode 922 thereon. Spacers 924 may be adjacent to an uppermost portion of the upper gate structure.

Referring again to FIG. 9, all of the upper stacked nanoribbons 914A, 914B, 914C and 914D (e.g., in this case 4) are coupled to the N-type source or drain structures 916. Also, both of the nanoribbons 904A and 904B are coupled to the P-type source or drain structures 906. However, the lower structure only includes two stacked nanoribbons 904A and 904B. The resulting structure effectively depopulates two of four channel regions of the P-type portion of the CMOS integrated circuit structure 900. However, channel count engineering is required to fabricate CMOS integrated circuit structure 900. It is to be appreciated that although the illustrative example of four upper wires and two lower wires and effectively two depopulated nanowires is depicted and described above, it is to be appreciated that all such wire counts may be varied.

Regarding a CMOS portion of a co-integrated structure, As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, a FIN-FET, a nanowire, or a nanoribbon.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

It is to be appreciated that the layers and materials described above in association with back end of line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc.

Each of the processor, the memory, and the chipset, may potentially be manufactured using the approaches disclosed herein.

Figure 10:
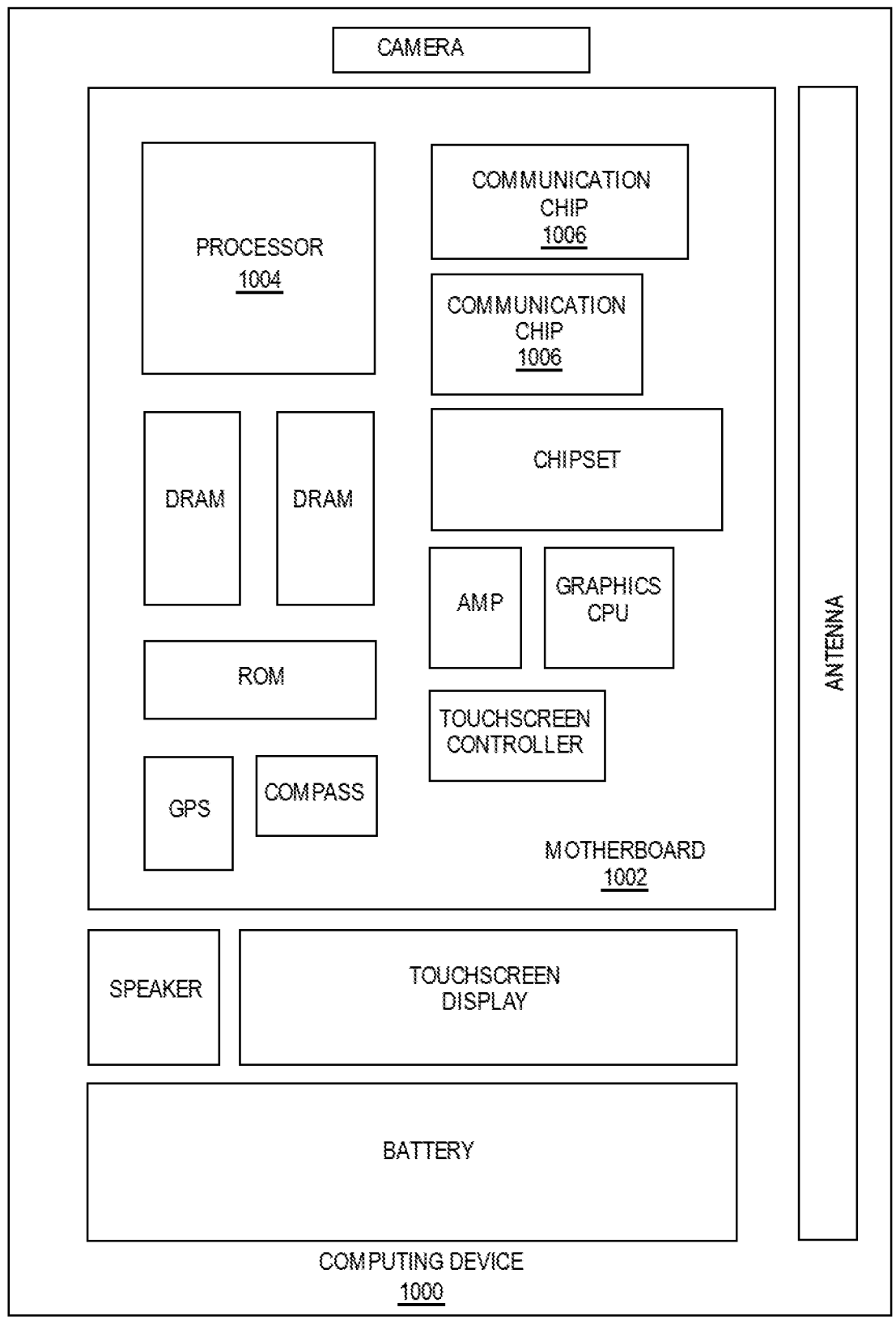
FIG. 10 illustrates a computing device in accordance with one implementation of the disclosure.

FIG. 10 illustrates a computing device 1000 in accordance with one implementation of the disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 1006 also includes an integrated circuit die packaged within the communication chip 1006. In accordance with another implementation of the disclosure, the integrated circuit die of the communication chip is built in accordance with implementations of the disclosure.

In further implementations, another component housed within the computing device 1000 may contain an integrated circuit die built in accordance with implementations of embodiments of the disclosure.

In various embodiments, the computing device 1000 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
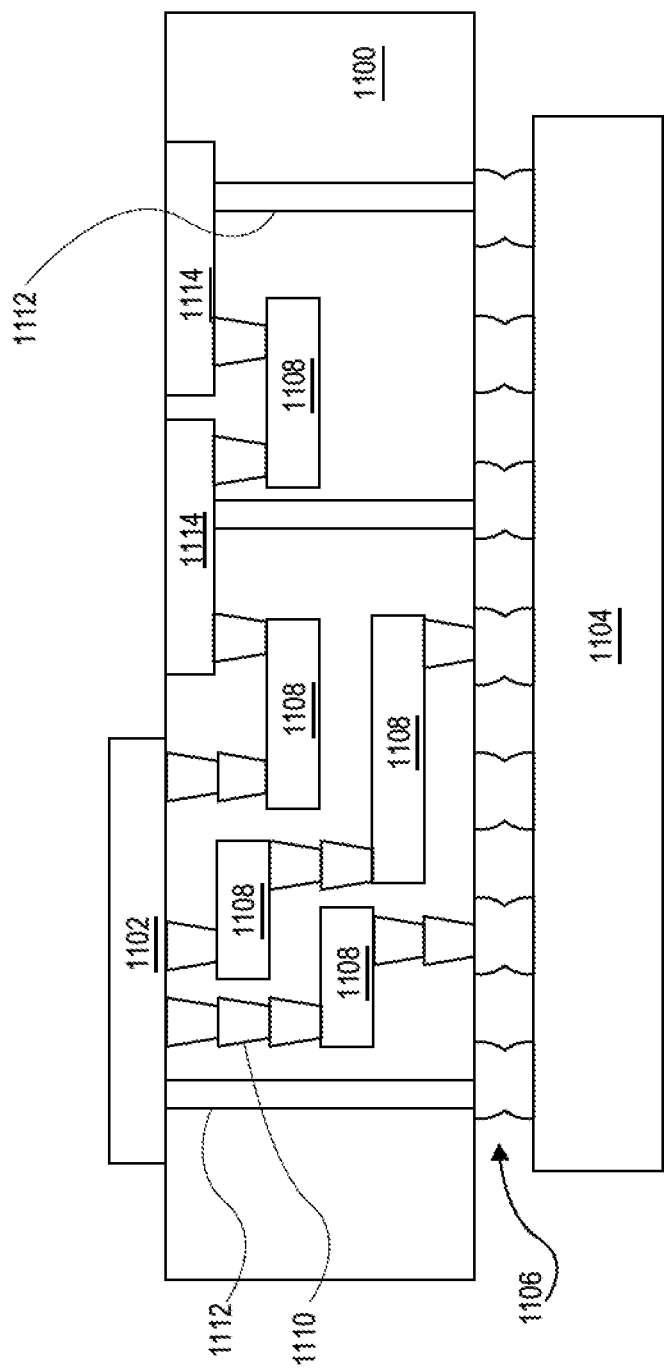
FIG. 11 illustrates an interposer that includes one or more embodiments of the disclosure.

FIG. 11 illustrates an interposer 1100 that includes one or more embodiments of the disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer 1100 may be formed of alternate rigid or flexible materials that may include the same materials described above for use in a semiconductor substrate, such as silicon, germanium, and other group III-V and group IV materials.

The interposer 1100 may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100 or in the fabrication of components included in the interposer 1100.

Figure 12:
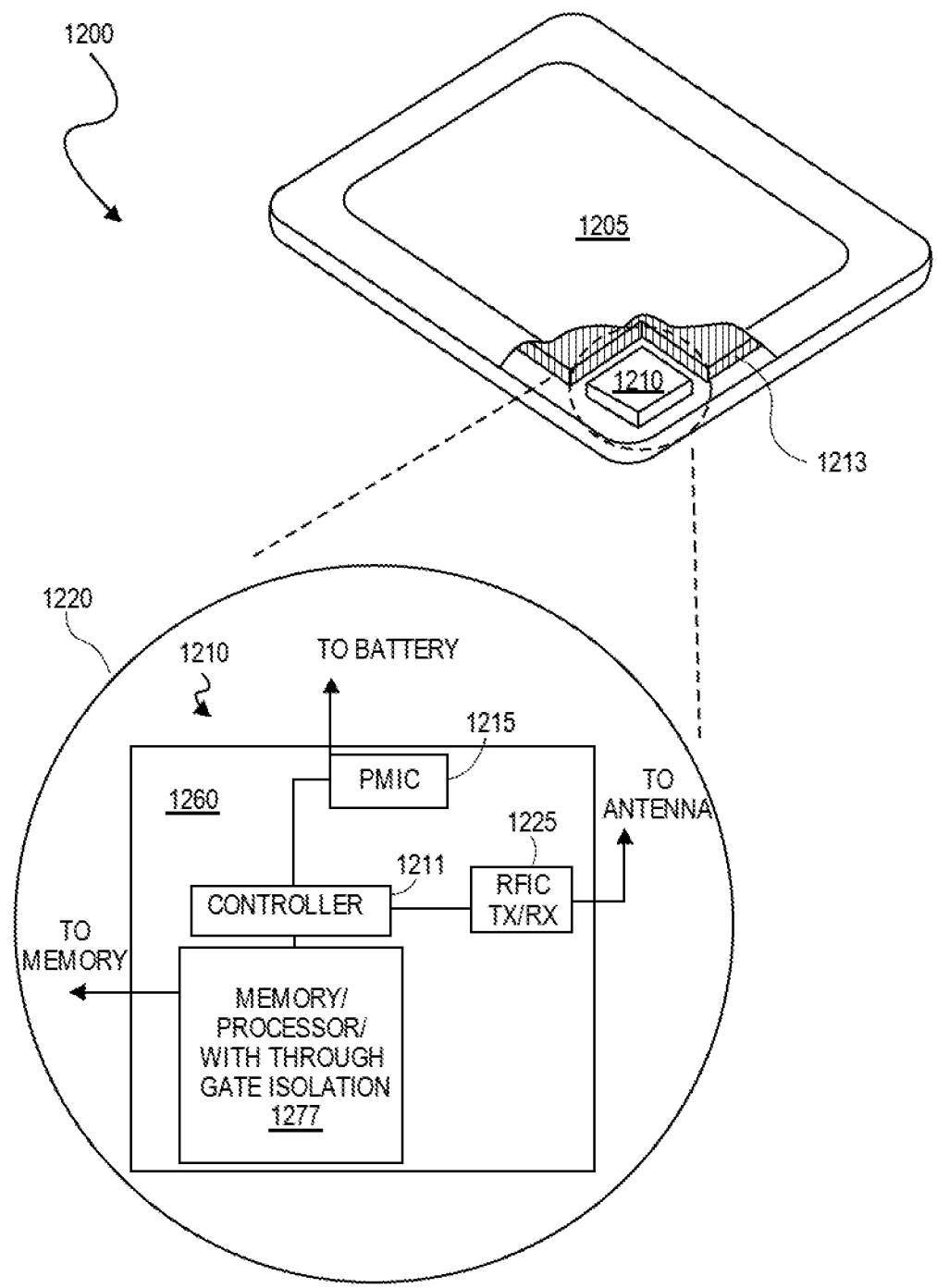
FIG. 12 is an isometric view of a mobile computing platform employing an IC fabricated according to one or more processes described herein or including one or more features described herein, in accordance with an embodiment of the present disclosure.

FIG. 12 is an isometric view of a mobile computing platform 1200 employing an integrated circuit (IC) fabricated according to one or more processes described herein or including one or more features described herein, in accordance with an embodiment of the present disclosure.

The mobile computing platform 1200 may be any portable device configured for each of electronic data display, electronic data processing, and wireless electronic data transmission. For example, mobile computing platform 1200 may be any of a tablet, a smart phone, laptop computer, etc. and includes a display screen 1205 which in the exemplary embodiment is a touchscreen (capacitive, inductive, resistive, etc.), a chip-level (SoC) or package-level integrated system 1210, and a battery 1213. As illustrated, the greater the level of integration in the system 1210 enabled by higher transistor packing density, the greater the portion of the mobile computing platform 1200 that may be occupied by the battery 1213 or non-volatile storage, such as a solid state drive, or the greater the transistor gate count for improved platform functionality. Similarly, the greater the carrier mobility of each transistor in the system 1210, the greater the functionality. As such, techniques described herein may enable performance and form factor improvements in the mobile computing platform 1200.

The integrated system 1210 is further illustrated in the expanded view 1220. In the exemplary embodiment, packaged device 1277 includes at least one memory chip (e.g., RAM), or at least one processor chip (e.g., a multi-core microprocessor and/or graphics processor) fabricated according to one or more processes described herein or including one or more features described herein. The packaged device 1277 is further coupled to the board 1260 along with one or more of a power management integrated circuit (PMIC) 1215, RF (wireless) integrated circuit (RFIC) 1225 including a wideband RF (wireless) transmitter and/or receiver (e.g., including a digital baseband and an analog front end module further includes a power amplifier on a transmit path and a low noise amplifier on a receive path), and a controller thereof 1211. Functionally, the PMIC 1215 performs battery power regulation, DC-to-DC conversion, etc., and so has an input coupled to the battery 1213 and with an output providing a current supply to all the other functional modules. As further illustrated, in the exemplary embodiment, the RFIC 1225 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1277 or within a single IC (SoC) coupled to the package substrate of the packaged device 1277.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include co-integrated gallium nitride (GaN) complementary metal oxide semiconductor (CMOS) integrated circuit technology.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A semiconductor structure includes a silicon (111) substrate having a first region and a second region. A structure including gallium and nitrogen is on the first region of the silicon (111) substrate, the structure including gallium and nitrogen having a top surface. A structure including germanium is on the second region of the silicon (111) substrate, the structure including germanium having a top surface co-planar with the top surface of the structure including gallium and nitrogen. A dielectric spacer is laterally between and in contact with the structure including gallium and nitrogen and the structure including germanium, the dielectric spacer on the silicon (111) substrate.

Example embodiment 2: The semiconductor structure of example embodiment 1, wherein the dielectric spacer has a top surface co-planar with the top surface of the structure including germanium and with the top surface of the structure including gallium and nitrogen.

Example embodiment 3: The semiconductor structure of example embodiment 1 or 2, wherein the structure including gallium and nitrogen includes a polarization layer on a gallium nitride layer.

Example embodiment 4: The semiconductor structure of example embodiment 3, wherein the polarization layer includes AlGaN or InAlGaN.

Example embodiment 5: The semiconductor structure of example embodiment 1, 2, 3 or 4, wherein the structure including gallium and nitrogen includes a gallium nitride layer on an AlN layer.

Example embodiment 6: The semiconductor structure of example embodiment 1, 2, 3, 4 or 5, wherein the structure including germanium includes a layer of SiGe on a layer of Ge.

Example embodiment 7: The semiconductor structure of example embodiment 1, 2, 3, 4 or 5, wherein the structure including germanium includes a first layer of SiGe on a second layer of SiGe, the second layer of SiGe having a greater germanium concentration than the first layer of SiGe.

Example embodiment 8: The semiconductor structure of example embodiment 1, 2, 3, 4, 5, 6 or 7, wherein the dielectric spacer includes silicon nitride or silicon oxide.

Example embodiment 9: The semiconductor structure of example embodiment 1, 2, 3, 4, 5, 6, 7 or 8, wherein the structure including gallium and nitrogen has a first plurality of semiconductor devices thereon, the first plurality of semiconductor devices having a voltage supply in a range of 5-10 Volts, and wherein the structure including germanium has a second plurality of semiconductor devices thereon, the second plurality of semiconductor devices having a voltage supply of approximately 1 Volt.

Example embodiment 10: The semiconductor structure of example embodiment 9, wherein the second plurality of semiconductor devices is a plurality of complementary metal oxide semiconductor (CMOS) devices.

Example embodiment 11: An integrated circuit structure includes a gallium nitride (GaN) layer above a substrate. A germanium-containing structure is above the substrate, the germanium-containing structure separated from the GaN layer by a dielectric spacer laterally between the germanium-containing structure and the GaN layer. A plurality of gate structures is over the GaN layer. A source region on a first side of the plurality of gate structures, a drain region is on a second side of the plurality of gate structures, the second side opposite the first side, and a drain field plate is above the drain region wherein the drain field plate is electrically coupled to the source region. A plurality of complementary metal oxide semiconductor (CMOS) devices is over the germanium-containing structure.

Example embodiment 12: The integrated circuit structure of example embodiment 11, wherein a voltage applied to the drain field plate is different from a gate voltage applied to the plurality of gate structures.

Example embodiment 13: The integrated circuit structure of example embodiment 11, wherein a voltage applied to the drain field plate is Vss.

Example embodiment 14: The integrated circuit structure of example embodiment 11, 12 or 13, wherein the drain field plate has a top surface, wherein the top surface of the drain field plate is substantially coplanar with a top surface of the plurality of gate structures.

Example embodiment 15: The integrated circuit structure of example embodiment 11, 12, 13 or 14, wherein each of the plurality of gate structures has a T gate structure.

Example embodiment 16: The integrated circuit structure of example embodiment 11, 112, 3, 14 or 15, further including a drain metal contact wherein the drain field plate is located laterally between the drain metal contact and the plurality of gate structures.

Example embodiment 17: An integrated circuit structure includes a gallium nitride layer above a substrate. A germanium-containing structure is above the substrate, the germanium-containing structure separated from the GaN layer by a dielectric spacer laterally between the germanium-containing structure and the GaN layer. A gate stack over the gallium nitride layer, a source region is on a first side of the gate stack, and a drain region is on a second side of the gate stack, the second side opposite the first side. The gate stack has a gate length in a first direction extending from the source region to the drain region, the gate stack having a gate width in a second direction perpendicular to the first direction and parallel to the source region and the drain region. The integrated circuit structure also includes a polarization layer beneath the gate stack and on the GaN layer, the polarization layer having a first portion having a first thickness under a first gate portion of the gate stack, the polarization layer having a second portion having a second thickness under a second gate portion of the gate stack, the first gate portion along a first portion of the gate width and the second gate portion along a second portion of the gate width, wherein the second thickness is greater than the first thickness. A plurality of complementary metal oxide semiconductor (CMOS) devices is over the germanium-containing structure.

Example embodiment 18: The integrated circuit structure of example embodiment 17, wherein the first thickness is a zero thickness.

Example embodiment 19: The integrated circuit structure of example embodiment 17, wherein the first thickness is a non-zero thickness.

Example embodiment 20: The integrated circuit structure of example embodiment 17, 18 or 19, wherein the second thickness is sufficiently thicker compared to the first thickness such that the transistor has a first threshold voltage for the first gate portion and a second threshold voltage for the second gate portion, wherein the first threshold voltage is greater than the second threshold voltage.

Example embodiment 21: The integrated circuit structure of example embodiment 17, 18, 19 or 20, wherein the gate stack includes a gate dielectric above the GaN layer and a gate electrode on the gate dielectric.

Example embodiment 22: The integrated circuit structure of example embodiment 17, 18, 19, 20 or 21 wherein the polarization layer includes: aluminum, indium and nitrogen.

What is claimed is:
1. A semiconductor structure, comprising:
a silicon (111) substrate having a first region and a second region;
a structure comprising gallium and nitrogen on the first region of the silicon (111) substrate, the structure comprising gallium and nitrogen having an uppermost surface and a bottommost surface;
a structure comprising germanium on the second region of the silicon (111) substrate, the structure comprising germanium having an uppermost surface co-planar with the uppermost surface of the structure comprising gallium and nitrogen, and the structure comprising germanium having a bottommost surface co-planar with the bottommost surface of the structure comprising gallium and nitrogen; and a dielectric spacer laterally between and in contact with the structure comprising gallium and nitrogen and the structure comprising germanium, the dielectric spacer on the silicon (111) substrate, wherein the dielectric spacer has an uppermost surface co-planar with the uppermost surface of the structure comprising germanium and with the uppermost surface of the structure comprising gallium and nitrogen, and wherein the dielectric spacer has a bottommost surface co-planar with the bottommost surface of the structure comprising germanium and with the bottommost surface of the structure comprising gallium and nitrogen.

2. The semiconductor structure of claim 1, wherein the structure comprising gallium and nitrogen comprises a polarization layer on a gallium nitride layer.

3. The semiconductor structure of claim 2, wherein the polarization layer comprises AlGaN or InAlGaN.

4. The semiconductor structure of claim 1, wherein the structure comprising gallium and nitrogen comprises a gallium nitride layer on an AlN layer.

5. The semiconductor structure of claim 1, wherein the structure comprising germanium comprises a layer of SiGe on a layer of Ge.

6. The semiconductor structure of claim 1, wherein the structure comprising germanium comprises a first layer of SiGe on a second layer of SiGe, the second layer of SiGe having a greater germanium concentration than the first layer of SiGe.

7. The semiconductor structure of claim 1, wherein the dielectric spacer comprises silicon nitride or silicon oxide.

8. The semiconductor structure of claim 1, wherein the structure comprising gallium and nitrogen has a first plurality of semiconductor devices thereon, the first plurality of semiconductor devices having a voltage supply in a range of 5-10 Volts, and wherein the structure comprising germanium has a second plurality of semiconductor devices thereon, the second plurality of semiconductor devices having a voltage supply of approximately 1 Volt.

9. The semiconductor structure of claim 8, wherein the second plurality of semiconductor devices is a plurality of complementary metal oxide semiconductor (CMOS) devices.

* * * * *